(12) United States Patent  (10) Patent No.: US 8,518,183 B2
Honma  (45) Date of Patent: *Aug. 27, 2013

(54) FILM DEPOSITION APPARATUS, SUBSTRATE PROCESS APPARATUS, FILM DEPOSITION METHOD, AND COMPUTER READABLE STORAGE MEDIUM

(75) Inventor: Manabu Honma, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 860 days.

This patent is subject to a terminal disclaimer.

(21) Appl. No.: 12/547,711

(22) Filed: Aug. 26, 2009

(65) Prior Publication Data

US 2010/0055315 A1 Mar. 4, 2010

(30) Foreign Application Priority Data

Sep. 4, 2008 (JP) ................................. 2008-227033

(51) Int. Cl.
*C23C 16/00* (2006.01)
*H01L 21/306* (2006.01)

(52) U.S. Cl.
USPC ............................ 118/719; 118/715; 118/733

(58) Field of Classification Search
USPC ................... 118/719, 715, 733; 156/345.31, 156/345.32
See application file for complete search history.

(56) References Cited

U.S. PATENT DOCUMENTS

| 5,188,501 | A | * | 2/1993 | Tomita et al. ............ 414/416.08 |
| 6,340,501 | B1 | | 1/2002 | Kamiyama et al. |
| 6,634,314 | B2 | | 10/2003 | Hwang et al. |
| 7,153,542 | B2 | | 12/2006 | Nguyen et al. |
| 2004/0216672 | A1 | * | 11/2004 | Ishii et al. ...................... 118/719 |
| 2006/0073276 | A1 | * | 4/2006 | Antonissen ................ 427/248.1 |
| 2006/0177579 | A1 | * | 8/2006 | Shin et al. .................. 427/248.1 |
| 2007/0218701 | A1 | | 9/2007 | Shimizu et al. |
| 2007/0218702 | A1 | | 9/2007 | Shimizu et al. |
| 2008/0096369 | A1 | | 4/2008 | Strzyzewski et al. |

FOREIGN PATENT DOCUMENTS

| CN | 1269046 A | 10/2000 |
| JP | 04-287912 | 10/1992 |
| JP | 2001-040480 | 2/2001 |
| JP | 3144664 | 3/2001 |
| JP | 2001-254181 | 9/2001 |
| JP | 2007-247066 | 9/2007 |
| JP | 2008-509547 | 3/2008 |

* cited by examiner

*Primary Examiner* — Karla Moore
(74) *Attorney, Agent, or Firm* — IPUSA, PLLC

(57) ABSTRACT

A film deposition apparatus is configured to deposit a film on a substrate by carrying out a cycle of alternately supplying at least two kinds of reaction gases that react with each other to the substrate to stack multiple layers of a reaction product in a vacuum chamber so that a thin film is formed. The film deposition apparatus includes a rotation table, a substrate providing area, a first reaction gas supplying part, a second reaction gas supplying part, a separation area, a center part area, an evacuation opening, and a substrate cooling part.

14 Claims, 22 Drawing Sheets

FILM DEPOSITION APPARATUS, SUBSTRATE PROCESS APPARATUS, FILM DEPOSITION METHOD, AND COMPUTER READABLE STORAGE MEDIUM

CROSS-REFERENCE TO RELATED APPLICATIONS

This patent application is based upon and claims the benefit of priority of Japanese Patent Application No. 2008-227033 filed on Sep. 4, 2008, the entire contents of which are incorporated herein by reference.

BACKGROUND OF THE INVENTION

1. Field of the Invention

The present invention generally relates to deposition apparatuses, substrate process apparatuses, film deposition methods, and computer readable storage media. More specifically, the present invention relates to a film deposition apparatus, a substrate process apparatus and a film deposition method for depositing a film on a substrate by repeatedly carrying out cycles of supplying in turn at least two source gases to the substrate in order to form a layer of a reaction product, and a computer readable storage medium storing a computer program for causing the film deposition apparatus to carry out the film deposition method.

2. Description of the Related Art

As a film deposition technique in a semiconductor manufacturing process, there is known a so-called Atomic Layer Deposition (ALD) or Molecular Layer Deposition (MLD). In such a film deposition technique, a first reaction gas is adsorbed on a surface of a semiconductor wafer (hereinafter a "wafer") under a vacuum environment and then a second reaction gas is adsorbed on the surface of the wafer in order to form one or more atomic or molecular layers through reaction of the first and the second reaction gases on the surface of the wafer; and such an alternating adsorption of the gases is repeated plural times, thereby depositing a film on the wafer. This technique is advantageous in that the film thickness can be controlled at higher accuracy by the number of times alternately supplying the gases, and in that the deposited film can have excellent uniformity over the wafer. Therefore, this deposition method is thought to be promising as a film deposition technique that can address further miniaturization of semiconductor devices.

Such a film deposition method may be preferably used, for example, for depositing a dielectric material to be used as a gate insulator. When silicon dioxide ($SiO_2$) is deposited as the gate insulator, a bis (tertiary-butylamino) silane (BTBAS) gas or the like is used as a first reaction gas (source gas) and ozone gas or the like is used as a second gas (oxidation gas).

In order to carry out such a deposition method, use of a single-wafer deposition apparatus having a vacuum chamber and a shower head at a top center part of the vacuum chamber has been under consideration. In such a deposition apparatus, the reaction gases are introduced into the chamber from the top center part, and unreacted gases and by-products are evacuated from a bottom part of the chamber. When such a deposition chamber is used, it takes a long time for a purge gas to purge the reaction gases, resulting in an extremely long process time because the number of cycles may reach several hundred. Therefore, a deposition method and an apparatus that enable high throughput are desired.

Under these circumstances, film deposition apparatuses having a vacuum chamber and a rotation table that holds plural wafers along a rotational direction have been proposed.

Patent Document 1 describes the following structure. A flattened cylindrical-shaped vacuum chamber is divided into a left side area and a right side area. Evacuation openings are formed along outlines of semicircles at the left side area and the right side area for upward evacuation. An eject opening of separation gas is formed between the outline of the left side semicircle and the outline of the right side semicircle, namely a diameter area of the vacuum chamber. A supply area of a different material gas is formed in each of a right side semicircle area and a left side semicircle area. By rotating a rotation table in the vacuum chamber, a work piece passes through the right side semicircle area, the separation area D, and the left side semicircle area and the material gases are evacuated from the evacuation opening.

Patent Document 2 describes a process chamber having a wafer support member (rotation table) that holds plural wafers and that is horizontally rotatable, first and second gas ejection nozzles that are located at equal angular intervals along the rotation direction of the wafer support member and oppose the wafer support member, and purge nozzles that are located between the first and the second gas ejection nozzles. The gas ejection nozzles extend in a radial direction of the wafer support member. A top surface of the wafers is higher than a top surface of the wafer support member, and the distance between the ejection nozzles and the wafers on the wafer support member is about 0.1 mm or more. A vacuum evacuation apparatus is connected to a part between the outer edge of the wafer support member and the inner wall of the process chamber. According to a process chamber so configured, the purge gas nozzles discharge purge gases to create a gas curtain, thereby preventing the first reaction gas and the second reaction gas from being mixed.

Patent Document 3 describes a process chamber that is divided into plural process areas along the circumferential direction by plural partitions. Below the partitions, a circular rotatable susceptor on which plural wafers are placed is provided leaving a slight gap in relation to the partitions.

Patent Document 4 describes a structure where a circular-shaped gas supply plate is divided into eight parts in a circumferential direction. A supply opening of $AsH_2$ gas, a supply opening of $H_2$ gas, a supply opening of TMG gas, and a supply opening of $H_2$ gas are arranged with gaps of 90 degrees. In addition, evacuation openings are provided between neighboring gas openings. A susceptor configured to support a wafer and facing these gas supply openings is rotated.

Patent Document 5 describes a process chamber having a circular plate that is divided into four quarters by partition walls and has four susceptors respectively provided in the four quarters, four injector pipes connected into a cross shape, and two evacuation ports located near the corresponding susceptors. In this process chamber, four wafers are mounted in the corresponding four susceptors, and the four injector pipes rotate around the center of the cross shape above the circular plate while ejecting a source gas, a purge gas, a reaction gas, and another purge gas, respectively.

Furthermore, Patent Document 6 (Patent Documents 7, 8) describes a film deposition apparatus preferably used for an Atomic Layer CVD method that causes plural gases to be alternately adsorbed on a target (a wafer). In the apparatus, a susceptor that holds the wafer is rotated, while source gases and purge gases are supplied to the susceptor from above. Paragraphs 0023, 0024, and 0025 of the document describe partition walls that extend in a radial direction from the center of a chamber, and gas ejection holes that are formed in the bottom of the partition walls in order to supply the source gases or the purge gas to the susceptor, so that an inert gas as the purge gas ejected from the gas ejection holes produces a gas curtain. Regarding evacuation of the gases, paragraph 0058 of the document describes that the source gases are evacuated through an evacuation channel 30a, and the purge gases are evacuated through an evacuation channel 30b. With such a configuration, the source gases can flow into a purge gas compartment from source gas compartments located on both sides of the purge gas compartment and the gases can be mixed with each other in the purge gas compartment. As a result, a reaction product is generated in the purge gas compartment, which may cause particles to fall onto the wafer.

[Patent Document 1] U.S. Pat. No. 7,153,542 (FIGS. 6A, 6B)
[Patent Document 2] Japanese Patent Application Laid-Open Publication No. 2001-254181 (FIGS. 1, 2)
[Patent Document 3] Japanese Patent Publication No. 3,144,664 (FIGS. 1, 2, claim 1)
[Patent Document 4] Japanese Patent Application Laid-Open Publication No. H4-287912
[Patent Document 5] U.S. Pat. No. 6,634,314
[Patent Document 6] Japanese Patent Application Laid-Open Publication No. 2007-247066 (paragraphs 0023 through 0025, 0058, FIGS. 12 and 13)
[Patent Document 7] U.S. Patent Publication No. 2007-213701
[Patent Document 8] U.S. Patent Publication No. 2007-218702

However, in the apparatus described in Patent Document 1, the upward evacuation openings are formed between the eject opening of the separation gas and the supply area of the reaction gas. In addition, the reaction gas is evacuated with the separation gas from the evacuation openings. Accordingly, the reaction gas ejected toward the work piece is drawn in from the evacuation openings as an upward flow so that particles in the chamber may be blown upward by the upward flow of the gases and fall on the wafers, leading to contamination of the wafers.

In addition, in the technique described in Patent Document 2, the wafer support member is rotated. Accordingly, it is not possible to prevent the reaction gas at both sides of the purge gas nozzle from passing by only the air curtain action from the purge gas nozzle. Hence, it is not possible to avoid the reaction gas being diffused in the air curtain from an upstream side in the rotational direction. Furthermore, the first reaction gas ejected from the first reaction gas ejecting nozzle easily reaches the second reaction gas diffusion area via a center part of the wafer support member corresponding to the rotation table. Once the first and second reaction gases are mixed on the wafer, an MLD (or ALD) mode film deposition cannot be carried out because the reaction product is adhered to a surface of the wafer.

In addition, in the technique described in Patent Document 3, the process gas is diffused to a neighboring process chamber from a gap between the partition and the susceptor. Furthermore, an evacuation room is provided among plural process chambers. Hence, when the wafer passes through the evacuation room, a gas from the process chamber at an upstream side and a gas from the process chamber at a downstream side are mixed. Because of this, this structure cannot be applied to the ALD type film deposition method.

In addition, Patent Document 4 does not provide any realistic measures to prevent two source gases ($AsH_3$, TMG) from being mixed. Because of the lack of such measures, the two source gases may be mixed around the center of the susceptor and through the $H_2$ gas supplying plates. Moreover, because the evacuation ports are located between the adjacent two gas supplying plates to evacuate the gases upward, particles are blown upward from the susceptor surface, which leads to wafer contamination.

In addition, in the technique described in Patent Document 5, after the source gas or the reaction gas is supplied to each of the four quarters, an atmosphere of each of the four quarters is displaced by purge gas by using the purge nozzle, which takes a long time. Furthermore, the source gas or the reaction gas is diffused from one of the four quarters to the neighboring ones of the four quarters beyond vertical walls. Hence, both gases may be reacted in the four quarters.

SUMMARY OF THE INVENTION

Accordingly, embodiments of the present invention may provide a novel and useful film deposition apparatus, substrate process apparatus, film deposition method, and computer readable storage medium solving one or more of the problems discussed above.

More specifically, the embodiments of the present invention may provide a film deposition apparatus, a substrate process apparatus, a film deposition method, and a computer readable storage medium storing a computer program that causes the film deposition apparatus to carry out the film deposition method, wherein in a case where film deposition is done by carrying out plural cycles of alternately supplying plural reaction gases to a substrate to produce plural layers of the reaction products of the reaction gases on the substrate, the substrate after the deposition is cooled before being transferred to prevent thermal damage to a driving part configured to transfer the substrate and prevent modification or malfunction of the driving part.

Another aspect of the present invention may be to provide a film deposition apparatus configured to deposit a film on a substrate by carrying out a cycle of alternately supplying at least two kinds of reaction gases that react with each other to the substrate to stack multiple layers of a reaction product in a vacuum chamber so that a thin film is formed, the film deposition apparatus including:

a rotation table rotatably provided in the vacuum chamber;

a substrate providing area provided in one surface of the rotation table and where the substrate is provided;

a first reaction gas supplying part configured to supply a first reaction gas to the surface of the substrate where the substrate providing area is provided;

a second reaction gas supplying part configured to supply a second reaction gas to the surface of the substrate where the substrate providing area is provided, the second reaction gas supplying part being separated from the first reaction gas supplying part along a rotational direction of the rotation table;

a separation area located along the rotational direction between a first process area in which the first reaction gas is supplied and a second process area in which the second reaction gas is supplied so that an atmosphere of the first process area and an atmosphere of the second process area are separated from each other, the separation area including a separation gas supplying part configured to supply a first separation gas, and a ceiling surface configured to form in relation to the rotation table a thin space in which the first separation gas flows from the separation area to the process area side, the ceiling surface being positioned at both sides in the rotational direction of the separation gas supplying part;

a center part area that is located substantially in a center part of the chamber in order to separate the atmosphere of the first process area and the atmosphere of the second process area, the center part area having an ejection hole configured to eject a second separation gas and provided at a substrate providing surface side of the rotation table;

an evacuation opening configured to evacuate the reaction gas with the first separation gas diffused to both sides of the separation area and the second separation gas ejected from the center part area; and a substrate cooling part configured to jet nitrogen gas or inert gas onto the substrate in the vacuum chamber so that the substrate is cooled.

Another aspect of the present invention may be to provide a film deposition apparatus configured to deposit a film on a substrate by carrying out a cycle of alternately supplying at least two kinds of reaction gases that react with each other to the substrate to stack multiple layers of a reaction product in a vacuum chamber so that a thin film is formed, the film deposition apparatus including:

a rotation table rotatably provided in the vacuum chamber;

a plurality of substrate providing areas configured to receive the substrates, the substrate providing areas being provided on a same circumference of the rotation table;

a heating part configured to heat the rotation table;

a first reaction gas supplying part configured to supply a first reaction gas, the first reaction gas supplying part being provided at the substrate providing area side of the vacuum chamber;

a second reaction gas supplying part configured to supply a second reaction gas, the second reaction gas supplying part being provided at the substrate providing area side of the vacuum chamber, the second reaction gas supplying part being provided separately from the first second reaction gas supplying part;

a first separation gas supplying part configured to supply a first separation gas, the first separation gas supplying part being provided between a first process area and a second process area, the first process area being where the first reaction gas is supplied from the first reaction gas supplying part, the second process area being where the second reaction gas is supplied from the second reaction gas supplying part;

a transfer opening provided at a side wall of the vacuum chamber, the transfer opening being configured to be opened or closed by a gate valve, the transfer opening being used for transferring the wafer from an outside of the vacuum chamber to an inside of the vacuum chamber;

a transfer arm including two stick-shaped holding parts configured to hold the substrate, the transfer arm being configured to transfer the substrate via the transfer opening, one of the holding parts including at least one substrate holding part configured to hold the substrate, another of the holding parts including at least two substrate holding parts configured to hold the substrate; and a substrate cooling part configured to jet nitrogen gas or inert gas onto the substrate in the vacuum chamber so that the substrate is cooled.

Another aspect of the present invention may be to provide a substrate process apparatus, including:

a vacuum transfer room inside which a substrate transfer part is provided;

the film deposition apparatus as claimed in claim 1, the film deposition apparatus being hermetically connected to the vacuum transfer room; and a preparatory vacuum chamber hermetically connected to the vacuum transfer room, the preparatory vacuum chamber being configured to change atmosphere between a vacuum atmosphere and an air atmosphere.

Another aspect of the present invention may be to provide a film deposition method of depositing a film on a substrate by carrying out a cycle of alternately supplying at least two kinds of reaction gases that react with each other to the substrate to stack multiple layers of a reaction product in a vacuum chamber so that a thin film is formed, the film deposition method including the steps of:

providing the substrate in a substrate providing area of a rotation table situated inside the vacuum chamber;

heating the rotation table;

performing deposition by supplying a first reaction gas from a first reaction gas supplying part provided at the substrate providing area side of the vacuum chamber, supplying a second reaction gas from a second reaction gas supplying part provided at the substrate providing area side of the vacuum chamber and separately from the first second reaction gas supplying part, and supplying separation gas from a separation gas supplying part provided between the first reaction gas supplying part and the second reaction gas supplying part; and taking out the substrate from the substrate providing area after the step of performing the deposition, and cooling the substrate by jetting nitrogen gas or inert gas from a substrate cooling part provided in the vacuum chamber.

Another aspect of the present invention may be to provide a film deposition method of depositing a film on a substrate by carrying out a cycle of alternately supplying at least two kinds of reaction gases that react with each other to the substrate to stack multiple layers of a reaction product in a vacuum chamber so that a thin film is formed, the film deposition method including the steps of:

providing the substrate in a substrate providing area of a rotation table situated inside the vacuum chamber;

heating the rotation table;

performing deposition by supplying a first reaction gas from a first reaction gas supplying part provided at the substrate providing area side of the vacuum chamber, supplying a second reaction gas from a second reaction gas supplying part provided at the substrate providing area side of the vacuum chamber and separately from the first second reaction gas supplying part, and supplying separation gas from a separation gas supplying part provided between the first reaction gas supplying part and the second reaction gas supplying part;

raising the substrate from the substrate providing area with an elevation mechanism provided at the substrate providing area after the step of performing the deposition;

holding the substrate by a transfer arm, the transfer arm being configured to transfer the substrate from an inside of the vacuum chamber to an outside of the vacuum chamber via a transfer opening; and cooling the substrate by jetting nitrogen gas or inert gas from a substrate cooling part provided in the vacuum chamber after the substrate is held by the transfer arm.

Another aspect of the present invention may be to provide a film deposition method of depositing a film on a substrate by carrying out a cycle of alternately supplying at least two kinds of reaction gases that react with each other to the substrate to stack multiple layers of a reaction product in a vacuum chamber so that a thin film is formed, the film deposition method including the steps of:

providing the substrate in a substrate providing area of a rotation table situated inside the vacuum chamber;

heating the rotation table;

performing deposition by supplying a first reaction gas from a first reaction gas supplying part provided at the substrate providing area side of the vacuum chamber, supplying a second reaction gas from a second reaction gas supplying part provided at the substrate providing area side of the vacuum chamber and separately from the first second reaction gas supplying part, and supplying separation gas from a separation gas supplying part provided between the first reaction gas supplying part and the second reaction gas supplying part;

raising the substrate provided in the substrate providing area with a transfer arm after the step of performing the deposition, the transfer arm including two stick-shaped holding parts configured to hold the substrate, one of the holding parts including at least one substrate holding part configured to hold the substrate, another of the holding parts including at least two substrate holding parts configured to hold the substrate; and cooling the substrate by jetting nitrogen gas or inert gas onto the substrate in the vacuum chamber with a substrate cooling part, after the step of raising the substrate.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

According to the embodiments of the present invention, it is possible to provide a film deposition apparatus, a substrate process apparatus, a film deposition method, and a computer readable storage medium storing a computer program that causes the film deposition apparatus to carry out the film deposition method, wherein in a case where film deposition is done by carrying out plural cycles of alternately supplying plural reaction gases to a substrate to produce plural layers of the reaction products of the reaction gases on the substrate, the substrate after the deposition is cooled before being transferred to prevent thermal damage to a driving part configured to transfer the substrate and prevent modification or malfunction of the driving part.

DETAILED DESCRIPTION OF THE PREFERRED EMBODIMENTS

A description is given below, with reference to the FIG. 1 through FIG. 22 of embodiments of the present invention.

Figure 1:
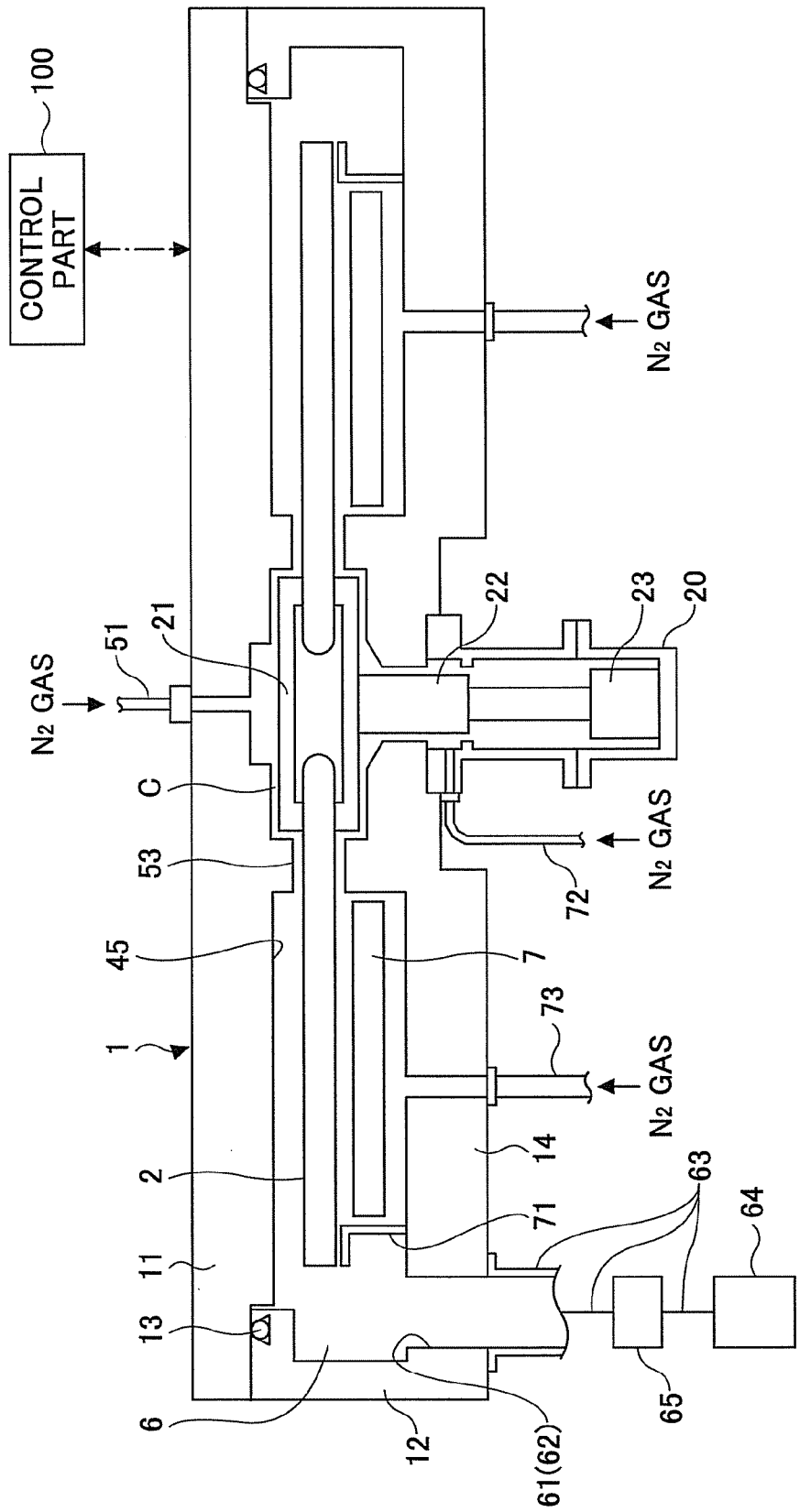
FIG. 1 is a vertical cross-sectional view of a film deposition apparatus of an embodiment of the present invention.

Referring to FIG. 1, a film deposition apparatus according to an embodiment of the present invention includes a vacuum chamber 1 having a flattened cylinder shape, and a rotation table 2. The rotation table 2 is located inside the chamber 1 and has a rotational center at the center of the vacuum chamber 1. The vacuum chamber 1 is made so that a ceiling plate 11 can be separated from a chamber body 12. The ceiling plate 11 is pressed onto the chamber body 12 via a ceiling member such as an O-ring 13, so that the vacuum chamber 1 is hermetically sealed. On the other hand, the ceiling plate 11 can be raised by a driving mechanism (not shown) when the ceiling plate 11 has to be removed from the chamber body 12.

The rotation table 2 is rotatably fixed onto a cylindrically shaped core part 21. The core part 21 is fixed on a top end of a rotational shaft 22 that extends in a vertical direction. The rotational shaft 22 pierces through a bottom part 14 of the chamber body 12 and is fixed at the lower end to a driving mechanism 23 that can rotate the rotational shaft 22 clockwise, in this embodiment. The rotational shaft 22 and the driving mechanism 23 are received in a case body 20 having the shape of a cylinder with a bottom. The case body 20 is hermetically fixed to a bottom surface of the bottom part 14 via a flanged pipe part, which isolates an inner environment of the case body 20 from an outer environment.

Figure 2:
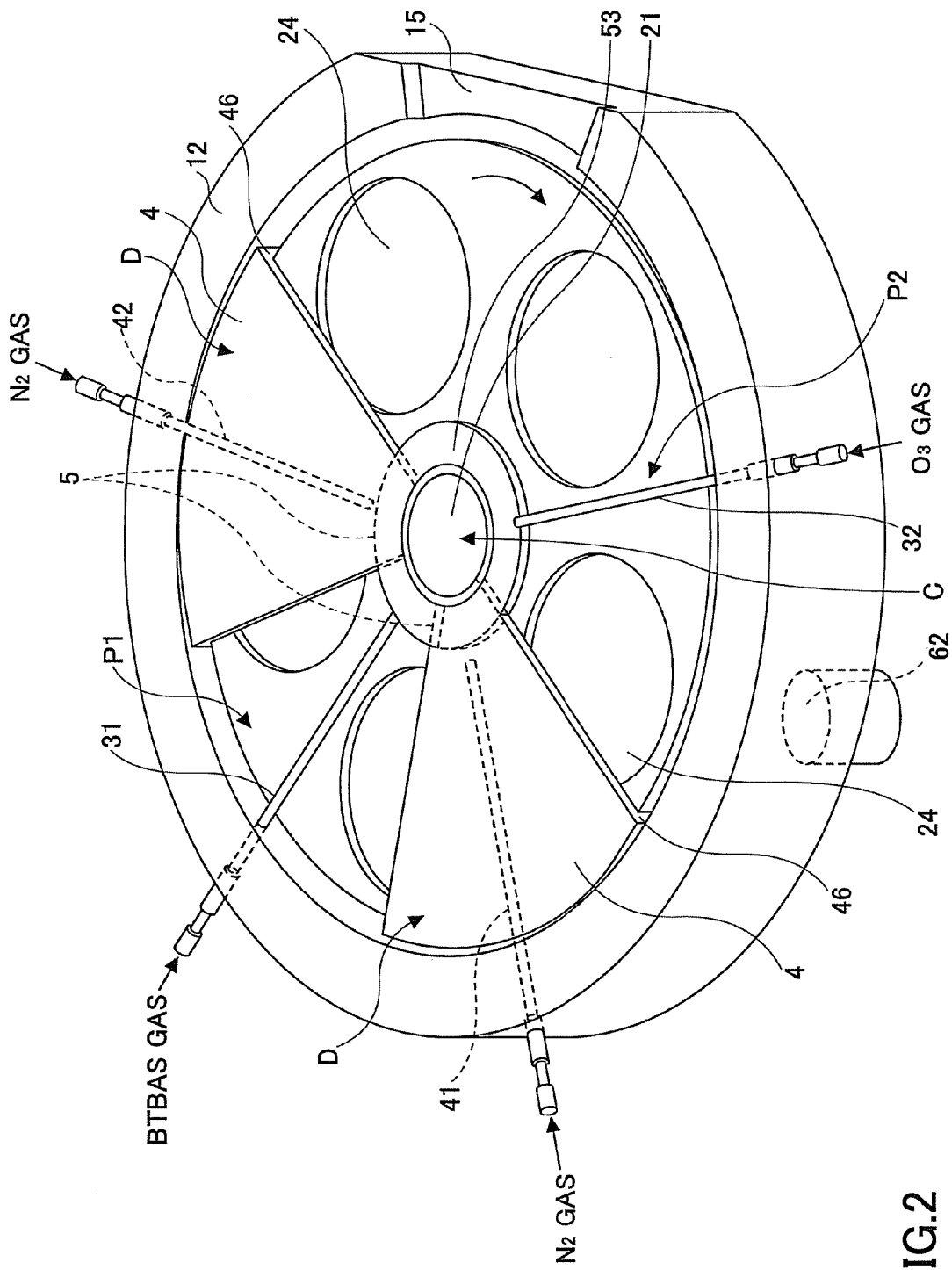
FIG. 2 is a perspective view of the film deposition apparatus shown in FIG. 1.
Figure 3:
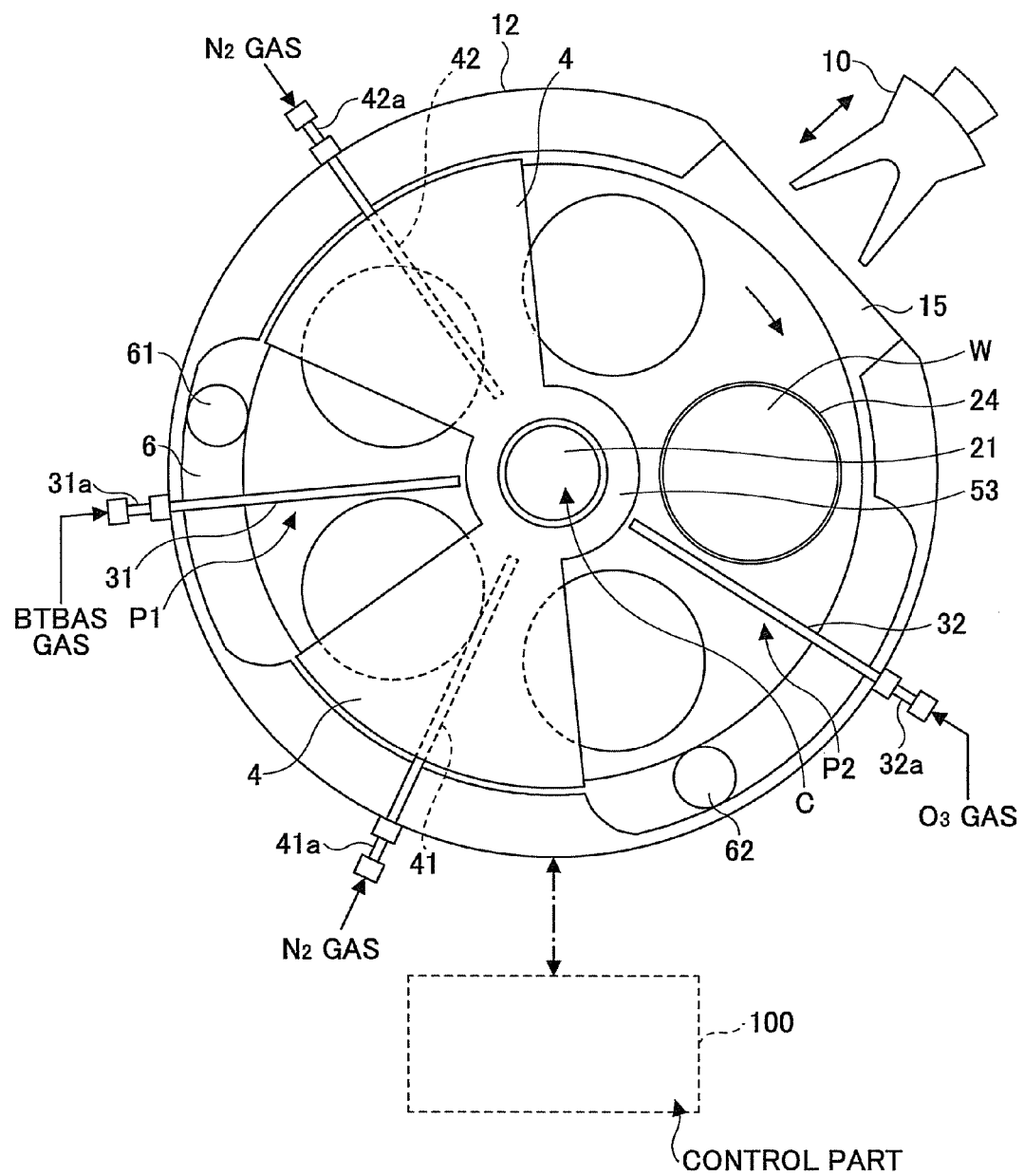
FIG. 3 is a plan view of the film deposition apparatus shown in FIG. 1.
Figure 4:
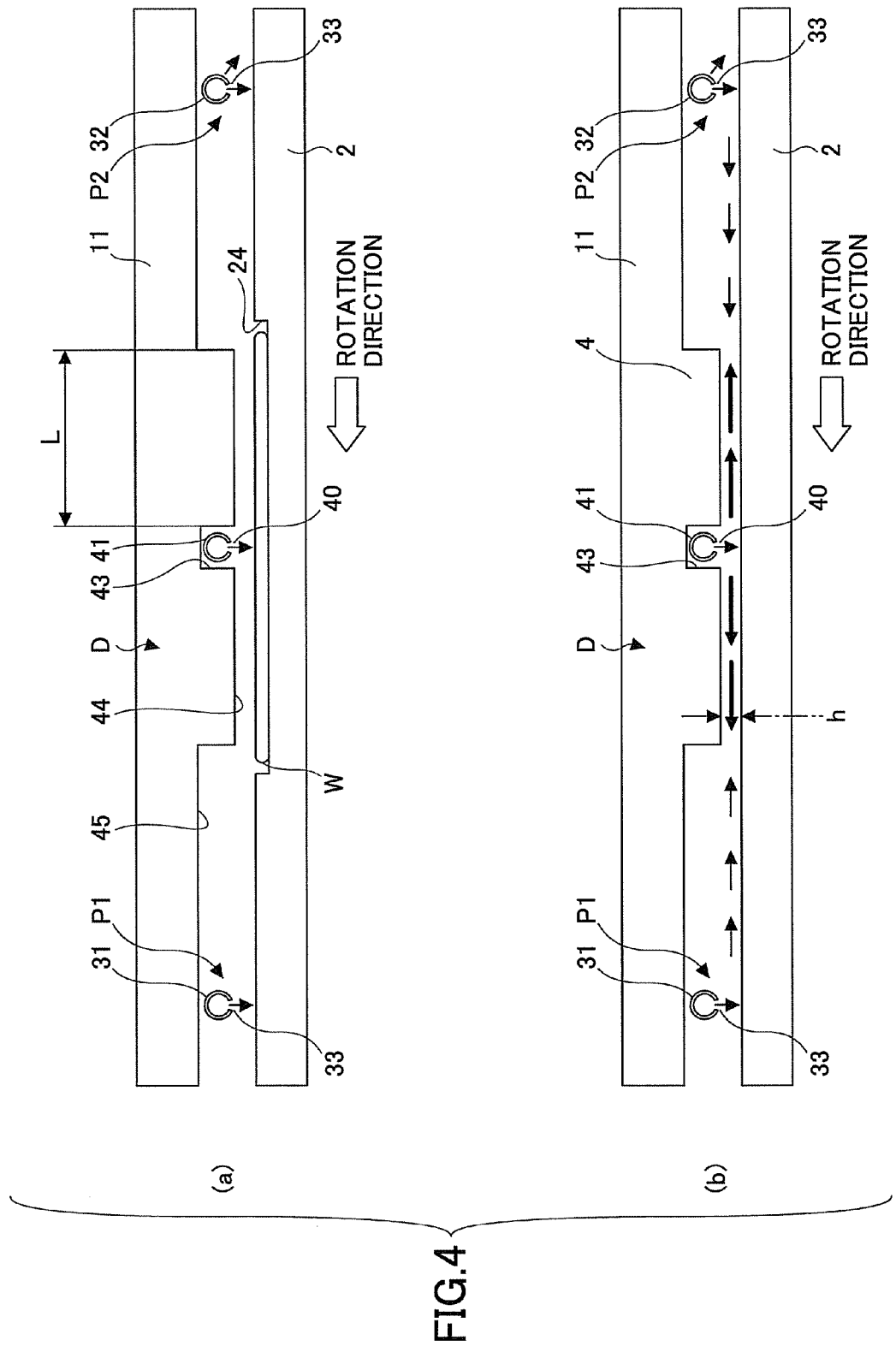
FIG. 4 is a vertical developed cross-sectional view showing a separation area and a process area.

As shown in FIGS. 2 and 3, plural (five in the illustrated example) circular concave parts 24, each of which receives a wafer W, are formed in a top surface of the rotation table 2 along a rotational direction (circumferential direction), although only one wafer W is shown in FIG. 3. FIG. 4 is a developed view of the rotation table 2 taken along a concentric circle and horizontally developed. As shown in FIG. 4(a), the concave part 24 has a diameter slightly larger, for example, by 4 mm, than the diameter of the wafer W and a depth equal to the thickness of the wafer W. Therefore, when the wafer W is placed in the concave part 24, the exposed surface of the wafer W is at the same elevation as the surface of an area of the rotation table 2, the area excluding the concave parts 24. If there is a relatively large step between the area and the wafer W, gas flow turbulence is caused by the step, which may affect thickness uniformity across the wafer W. This is why the two surfaces are at the same elevation. While "the same elevation" may mean here that a height difference is less than or equal to about 5 mm, the difference is made to be as close to zero as possible to the extent allowed by machining accuracy. In the bottom of the concave part 24, there are formed three through holes (not shown) through which three corresponding elevation pins (see FIG. 8) are raised/lowered. The elevation pins support a back surface of the wafer W and raise/lower the wafer W.

The concave parts 24 are configured to position the wafers W and prevent the wafers W from being thrown out by centrifugal force caused by rotation of the rotation table 2. The concave parts 24 correspond to a substrate providing part. The substrate providing part (wafer providing part) is not limited to the concave part 24. The substrate providing part may have a structure where, for example, plural guide members configured to guide a circumferential edge of the wafer are arranged in the circumferential direction of the wafer W at the surface of the rotation table 2. Alternatively, the substrate providing part may be an area where the wafer W is provided by attraction in a case where a chuck mechanism such as an electrostatic chuck is provided at the rotation table 2 so that the wafer W is held by an attraction force.

Referring back to FIGS. 2 and 3, the chamber 1 includes a first reaction gas nozzle 31, a second reaction gas nozzle 32, and separation gas nozzles 41, 42 above the rotation table 2, all of which extend in radial directions and at predetermined angular intervals. With this configuration, the concave parts 24 can move past and below the nozzles 31, 32, 41, and 42. In the illustrated example, the second reaction gas nozzle 32, the separation gas nozzle 41, the first reaction gas nozzle 31, and the separation gas nozzle 42 are arranged clockwise in this order. These gas nozzles 31, 32, 41, and 42 pierce through the circumferential wall part of the chamber body 12 and are supported by attaching their base ends, which are gas inlet ports 31a, 32a, 41a, 42a, respectively, on the outer circumference of the wall part. Although the gas nozzles 31, 32, 41, 42 are introduced into the chamber 1 from the circumferential wall part of the chamber 1 in the illustrated example, these nozzles 31, 32, 41, 42 may be introduced from a ring-shaped protrusion part 5 (described later). In this case, an L-shaped flow path may be provided in order to be open on the outer circumferential surface of the protrusion part 5 and on the outer top surface of the ceiling plate 11. With such an L-shaped flow path, the nozzle 31 (32, 41, 42) can be connected to one opening of the L-shaped flow path inside the chamber 1 and the gas inlet port 31a (32a, 41a, 42a) can be connected to the other opening of the L-shaped flow path outside the chamber 1.

Although not shown, the reaction gas nozzle 31 is connected to a gas supplying source of bis (tertiary-butylamino) silane (BTBAS), which is a first source gas, and the reaction gas nozzle 32 is connected to a gas supplying source of $O_3$ (ozone) gas, which is a second source gas. The separation gas nozzles 41, 42 are connected to gas supplying sources of $N_2$ (nitrogen) gas (not shown). In the illustrated example, the second reaction gas nozzle 32, the separation gas nozzle 41, the first reaction gas nozzle 31, and the separation gas nozzle 42 are arranged clockwise in this order.

The reaction gas nozzles 31, 32 have plural ejection holes 33 to eject the corresponding source gases downward. The plural ejection holes 33 are arranged in longitudinal directions of the reaction gas nozzles 31, 32 at predetermined intervals. In addition, the separation gas nozzles 41, 42 have plural ejection holes 40 to eject the separation gases downward from the plural ejection holes 40. The plural ejection holes 40 are arranged at predetermined intervals in longitudinal directions of the separation gas nozzles 41, 42. The reaction gas nozzles 31, 32 are a first reaction gas supplying part and a second reaction gas supplying part, respectively, in this embodiment. In addition, an area below the reaction gas nozzle 31 is a first process area P1 in which the BTBAS gas is adsorbed on the wafer W, and an area below the reaction gas nozzle 32 is a second process area P2 in which the $O_3$ gas is adsorbed on the wafer W.

The separation gas nozzles 41, 42 are provided in separation areas D that are configured to separate the first process area P1 and the second process area P2. In each of the separation areas D, there is provided a convex part 4 on the ceiling plate 11, as shown in FIGS. 2 through 4. The convex part 4 has a top view shape of a sector whose apex lies at the center of the chamber 1 and whose arced periphery lies near and along the inner circumferential wall of the chamber body 12. In addition, the convex part 4 has a groove part 43 that extends in the radial direction substantially bisecting the convex part 4. The separation gas nozzle 41 (42) is located in the groove part 43. A circumferential distance between the center axis of the separation gas nozzle 41 (42) and one side of the sector-shaped convex part 4 is substantially equal to the circumferential distance between the center axis of the separation gas nozzle 41 (42) and the other side of the sector-shaped convex part 4.

Accordingly, there are flat low ceiling surfaces 44 (first ceiling surfaces), as a lower surface of the convex part 4, on both sides in the circumferential direction of and adjacent to the separation gas nozzle 41 (42), and high ceiling surfaces 45 (second ceiling surfaces) on both sides in the circumferential direction of and spaced apart from the separation gas nozzle 41 (42). The convex part 4 provides a separation space, which is a thin space with height "h", between the convex part 4 and the rotation table 2 in order to prevent the first and the second source gases from entering the thin space and from being mixed.

Referring to FIG. 4(b), the $O_3$ gas is prevented from entering the thin space between the convex part 4 and the rotation table 2 from the upstream side in the rotational direction of the rotation table 2. The BTBAS gas is prevented from entering the thin space between the convex part 4 and the rotation table 2 from the downstream side in the rotational direction of the rotation table 2. "The gases being prevented from entering" means that the $N_2$ gas as the separation gas ejected from the separation gas nozzle 41 diffuses between the first ceiling surfaces 44 and the upper surface of the rotation table 2 and flows out to spaces below the second ceiling surfaces 45 adjacent to the corresponding first ceiling surfaces 44 in the illustrated example, so that the source gases cannot enter the thin separation space from the adjacent spaces. "The gases cannot enter the separation space" means not only that the gases are completely prevented from entering the thin space below the convex part 4 from the adjacent spaces, but also that small amounts of entering $O_3$ gas and BTBAS gas may be mixed in the thin space below the convex part 4. As long as such effect is demonstrated, it is possible to perform the separation action of the separation area D, namely separating the atmosphere of the first process area P1 and the atmosphere of the second process area P2. In addition, the gas adsorbed on the wafer W can pass through the separation area D. Therefore, the gases in "the gases being impeded from entering" mean the gases in a gaseous phase.

Referring to FIGS. 1, 2, and 3, a ring-shaped protrusion part 5 is provided on a lower surface of the ceiling plate 11 so that the inner circumference of the protrusion part 5 faces the outer circumference of the core part 21. The protrusion part 5 opposes the rotation table 2 at an outer area of the core part 21. In addition, the protrusion part 5 and the convex part 4 are formed in a body so that a lower surface of the protrusion part 5 and a lower surface of the convex part 4 form one plane surface. In other words, the height of the lower surface of the protrusion part 5 from the rotation table 2 is the same as the height of the lower surface (ceiling surface 44) of the convex part 4, which is the height h. The convex part 4 is formed not integrally with but may be formed separately from the protrusion part 5 in other embodiments. FIGS. 2 and 3 show the inner configuration of the chamber 1 whose top plate 11 is removed while the convex parts 4 remain inside the chamber 1.

With respect to a combination structure of the convex part 4 and the separation gas nozzle 41 (42), the groove part 43 is formed in the center of a single sector-shaped plate to be the convex part 4 and the separation gas nozzle 41 (42) is located in the groove part 43 in the above embodiment. However, two sector-shaped plates may be attached on the lower surface of the ceiling plate 11 by screws or bolts so that the two sector-shaped plates are located one on each side of the separation gas nozzle 41 (42).

In this embodiment, in the separation gas nozzle 41 (42), the ejection holes 40 having an inner diameter of about 0.5 mm are arranged at intervals of about 10 mm. In addition, in the reaction gas nozzle 31 (32), the ejection holes 33 having an inner diameter of about 0.5 mm are arranged at intervals of about 10 mm in this embodiment.

When the wafer W having a diameter of about 300 mm is to be processed in the chamber 1, the convex part 4 has a circumferential length of, for example, about 146 mm along an inner arc that is at a distance 140 mm from the rotational center of the rotation table 2, and a circumferential length of, for example, about 502 mm along an outer arc corresponding to the outermost part of the concave parts 24 of the rotation table 2 in this embodiment. In addition, a circumferential length from one side wall of the convex part 4 through the nearest side wall of the groove part 43 along the outer arc is about 246 mm.

In addition, the height h (see FIG. 4(*a*)) of the lower surface of the convex part 4, or the ceiling surface 44, measured from the top surface of the rotation table 2 (or the wafer W) is, for example, approximately 0.5 mm through approximately 10 mm, and preferably approximately 4 mm. In this case, the rotational speed of the rotation table 2 is, for example, 1 through 500 revolutions per minute (rpm). In order to ascertain the separation function performed by the separation area D, the size of the convex part 4 and the height h of the ceiling surface 44 from the rotation table 2 may be determined depending on the rotational speed of the rotation table 2 through experiment. The separation gas is $N_2$ in this embodiment but may be an inert gas such as He or Ar, or $H_2$ in other embodiments, as long as the separation gas does not affect the deposition of silicon dioxide.

Figure 5:
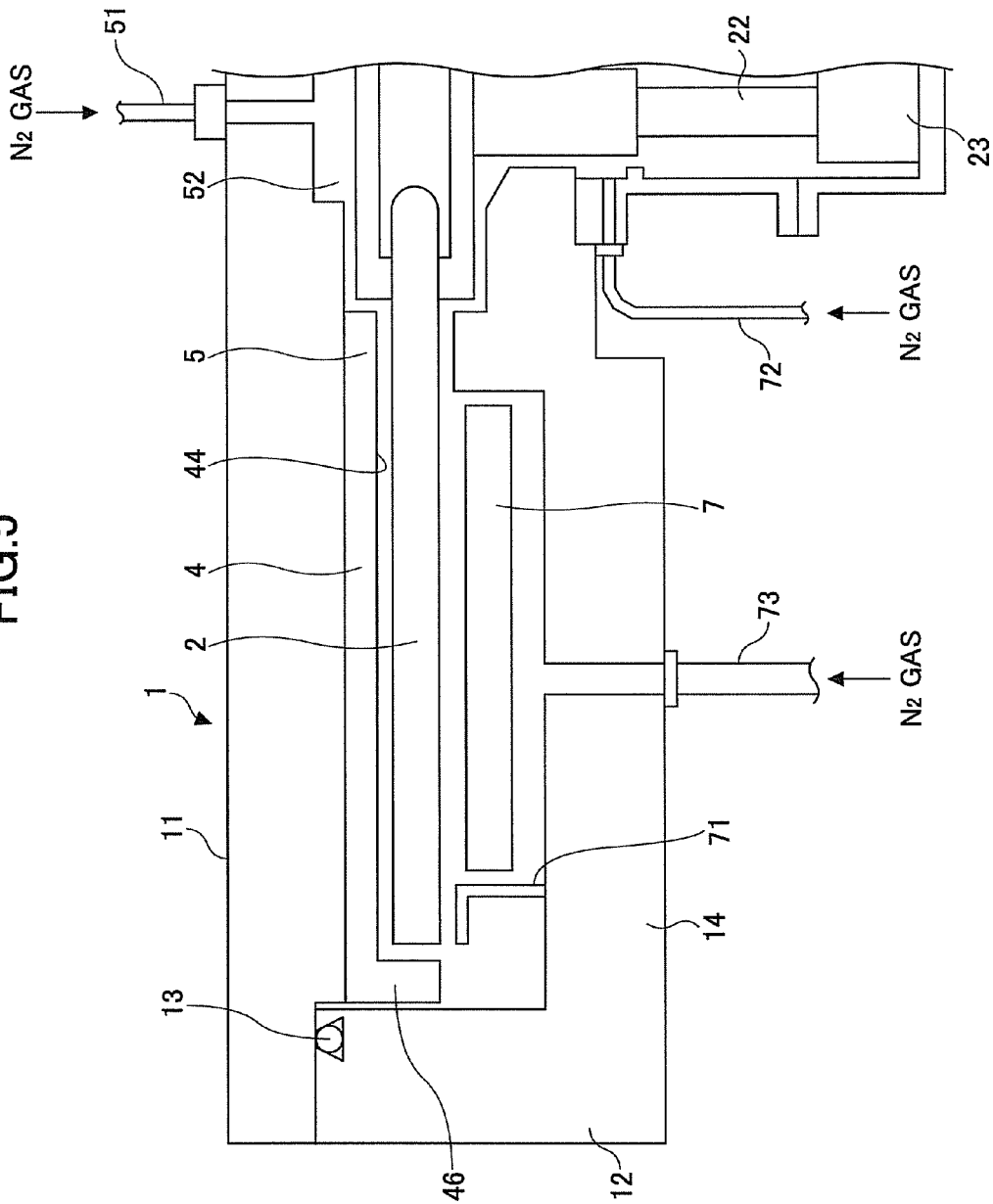
FIG. 5 is a vertical cross-sectional view of a part of the film deposition apparatus shown in FIG. 1.

At the lower surface of the ceiling plate 11 of the vacuum chamber 1, namely a ceiling surface seen from the wafer providing part (concave part 24) of the rotation table 2, as discussed above, the first ceiling surface 44 and the second ceiling surface 45 situated higher than the first ceiling surface 44 are provided in the circumferential direction. FIG. 1 is a vertical cross-sectional view of an area where the high ceiling surface 45 is provided. FIG. 5 is a vertical cross-sectional view of an area where the low ceiling surface 44 is provided. As shown in FIG. 2 and FIG. 5, a circumferential edge part of the sector-shaped convex part 4 (a part at an external edge side of the vacuum chamber 1) has a bent part 46 that bends in an L-shape so that the bent part 46 faces the external end surface of the rotation table 2. The sector-shaped convex part 4 is provided at the top plate 11 side so as to be separated from the chamber body 12. Accordingly, there are slight gaps between the external circumferential surface of the bent part 46 and the chamber body 12. Hence, the bent part 46, as well as the convex part 4, prevents the reaction gases from entering from both sides and from being mixed. The gaps between the internal circumferential surface of the bent part 46 and the external edge surface of the rotation table 2 and between the external circumferential surface of the bent part 46 and the chamber body 12 may be the same as the height h of the ceiling surface 44 from the rotation table 2. In the illustrated example, it can be seen from the surface side area of the rotation table 2 that the internal circumferential surface of the bent part 46 forms an internal circumferential wall of the vacuum chamber 1.

As shown in FIG. 5, in the separation area D, the internal circumferential wall of the chamber body 12 is vertically formed and close to the external circumferential surface of the bent part 46. In an area other than the separation area D, as shown in FIG. 1, the internal circumferential wall of the chamber body 12 forms a hollow part, with a rectangular shaped cross section, to the outside from a part facing the external edge surface of the rotational table 2 to the bottom part 14. This hollow part is called an evacuation area 6. For example, two evacuation ports 61 and 62 are provided, as shown in FIG. 1 and FIG. 3, at a bottom part of the evacuation area 6. The evacuation ports 61 and 62 are connected to a common vacuum pump 64 as a vacuum evacuation part via an evacuation pipe 63. Referring to FIG. 1, a pressure control part 65 may be provided for every evacuation port 61 (62) or may be commonly provided. The evacuation ports 61 and 62 are provided one at each side of (in between) the separation areas D in the rotational direction as seen from the top so that the separation action of the separation areas D securely functions and evacuation of each of the reaction gases (BTBAS gas and $O_3$ gas) is exclusively performed. In this embodiment, the evacuation port 61 is provided between the first reaction gas nozzle 31 and the separation area D neighboring a downstream side in the rotational direction relative to the reaction gas nozzle 31. The evacuation port 62 is provided between the second reaction gas nozzle 32 and the separation area D neighboring the downstream side in the rotation direction relative to the reaction gas nozzle 32. Although the two evacuation ports 61, 62 are made in the chamber body 12 in this embodiment, three evacuation ports may be provided in other embodiments. For example, an additional evacuation port may be made in an area between the separation area D including the separation gas nozzle 42 and the second reaction gas nozzle 32 neighboring the downstream side in the rotational direction relative to the separation area D. In addition, four or more evacuation ports may be provided. While the evacuation ports 61, 62 are located below the rotation table 2 to evacuate the chamber 1 through an area between the inner circumferential wall of the chamber body 12 and the outer circumferential surface of the rotation table 2 in the illustrated example, the evacuation ports may be located in the side wall of the chamber body 12. In addition, when the evacuation ports 61, 62 are provided in the side wall of the chamber body 12, the evacuation ports 61, 62 may be located higher than the rotation table 2. In this case, the gases flow along the upper surface of the rotation table 2 into the evacuation ports 61, 62 located higher than the rotation table 2. Therefore, it is advantageous in that particles in the chamber 1 are not blown upward by the gases, compared to when the evacuation ports are provided, for example, in the ceiling plate 11.

Figure 6:
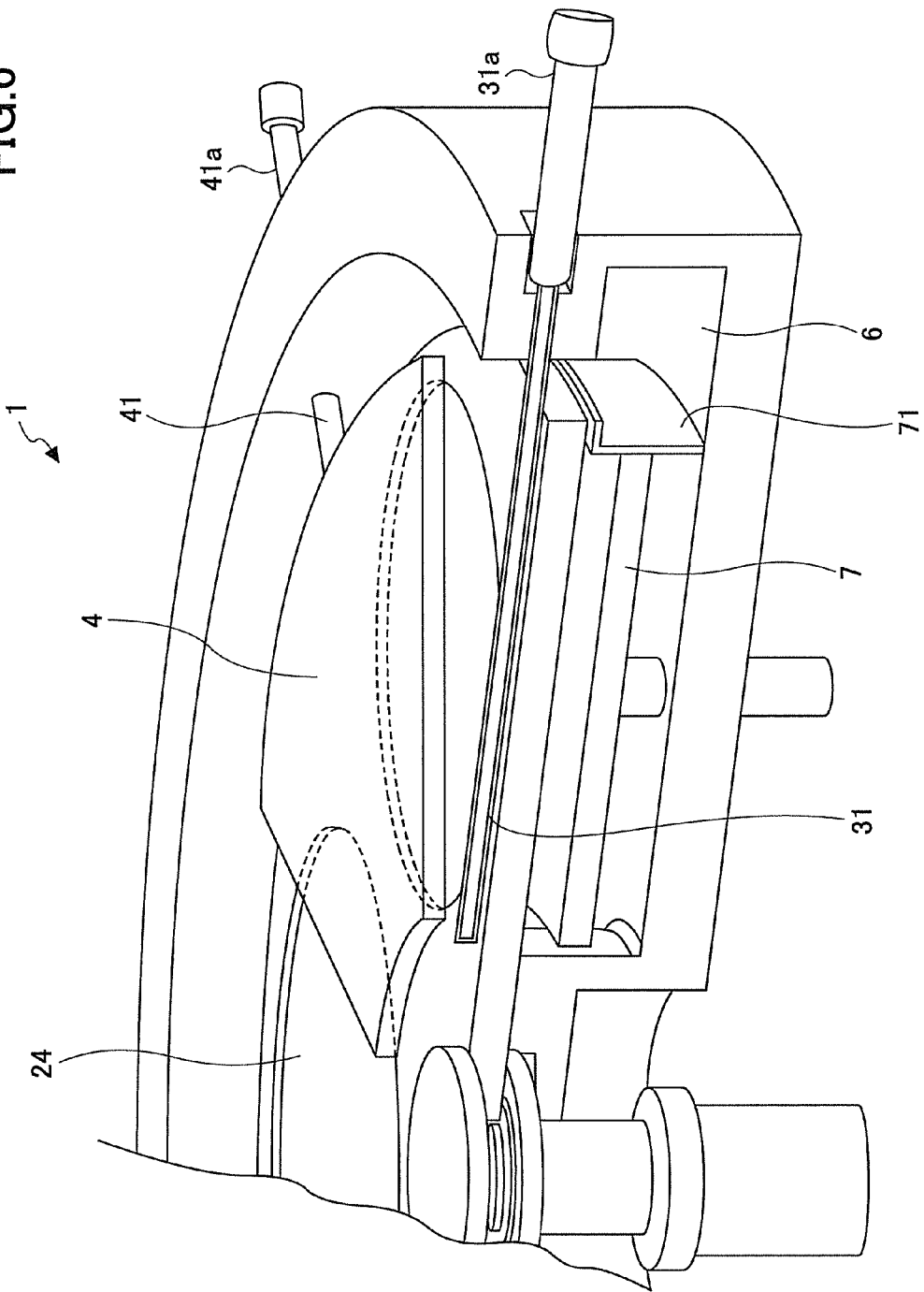
FIG. 6 is a cross-sectional and perspective view of a part of the film deposition apparatus shown in FIG. 1.

As shown in FIGS. 1, 2, and 6, a heater unit 7 as a heating part is provided in a space between the bottom part 14 of the chamber body 12 and the rotation table 2, so that the wafers W placed on the rotation table 2 are heated through the rotation table 2 at a temperature determined by a process recipe. In addition, a cover member 71 is provided beneath the rotation table 2 and near the outer circumference of the rotation table 2 in order to surround the heater unit 7, so that the space where the heater unit 7 is located is partitioned from the outside area by the cover member 71. The cover member 71 has a flange part at the top. The flange part is arranged so that a slight gap is maintained between the lower surface of the rotation table 2 and the flange part in order to prevent gas from flowing inside the cover member 71.

In an area of the bottom part 14 which area is a rotational center side compared to the space where the heater unit 7 is provided, a space in the vicinity of the center part of the lower surface of the rotation table 2 becomes narrow approaching the core part 21. In addition, a space between the rotational shaft 22 and an internal circumferential surface of a piercing hole of the rotational shaft 22 piercing the bottom part 14 is narrow. These spaces are in communication within the case body 20. A purge gas supplying pipe 72 is provided in the case body 20. The purge gas supplying pipe 72 is configured to supply $N_2$ gas as a purge gas in the narrow space for purging. In addition, plural purge gas supplying pipes 73 are provided in a position downstream of the heater unit 7 at the bottom part 14 of the vacuum chamber 1 in the circumferential direction. The purge gas supplying pipes 73 are configured to purge a space where the heater unit 7 is housed.

Figure 7:
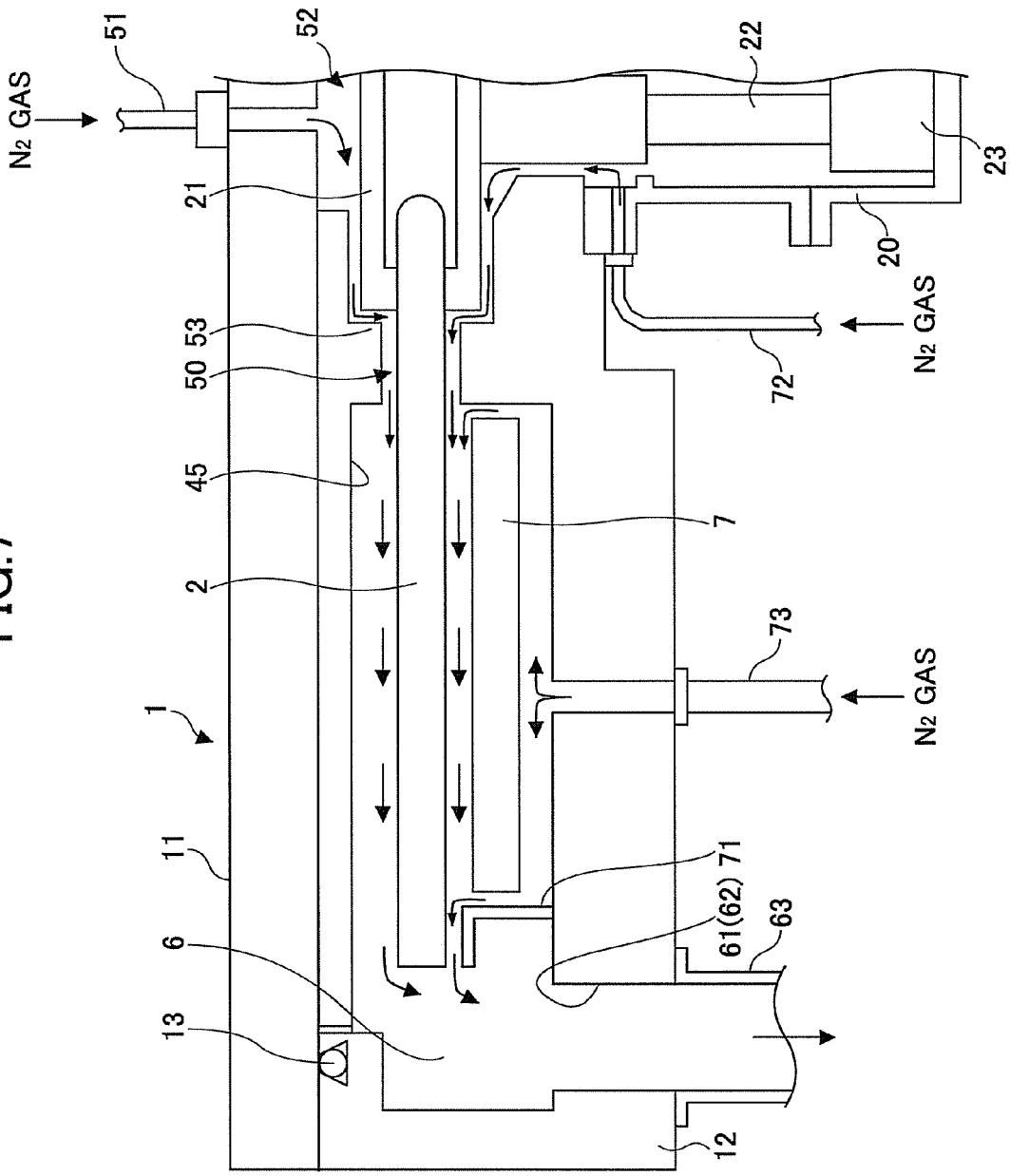
FIG. 7 is a view for explaining a state where separation gas or purge gas flows.

With these configurations, $N_2$ purge gas may flow from the purge gas supplying pipes 72 and 73 as indicated by arrows in FIG. 7 so that a space from inside of the case body 20 to the space where the heater unit 7 is provided is purged by $N_2$ purge gas. The purge gas is evacuated from the space between the rotation cover 2 and the cover member 71 to the evacuation ports 61 and 62 via the evacuation area 6. With this structure, BTBAS gas ($O_3$ gas) is prevented from flowing from the first processing area P1 (the second processing area P2) to the second processing area P2) (the first processing area P1) via a lower part of the rotation table 2. Hence, the purge gas functions as separation gas.

Referring to FIG. 7, a separation gas supplying pipe 51 is connected to the top center part of the ceiling plate 11 of the chamber 1, so that $N_2$ gas is supplied as a separation gas to a space 52 between the ceiling plate 11 and the core part 21. The separation gas supplied to the space 52 flows through a thin gap 50 between the protrusion part 5 and the rotation table 2 and then is ejected to the circumferential edge along a wafer providing part side surface, namely the top surface of the rotation table 2. Since a space surrounded by the protrusion part 5 is filled with the separation gas, the reaction gases (BTBAS gas and $O_3$ gas) cannot be mixed between the first processing area P1 and the second processing area P2 via the center part of the rotation table 2. In other words, the film deposition apparatus according to this embodiment is provided with a center area C that is defined by the center part of the rotation table 2 and the chamber 1 in order to isolate the first process area P1 and the second process area P2 and is configured to have an ejection opening that ejects the separation gas toward the top surface of the rotation table 2. The ejection opening corresponds to the gap 50 between the protrusion part 5 and the rotation table 2, in the illustrated example.

Figure 8:
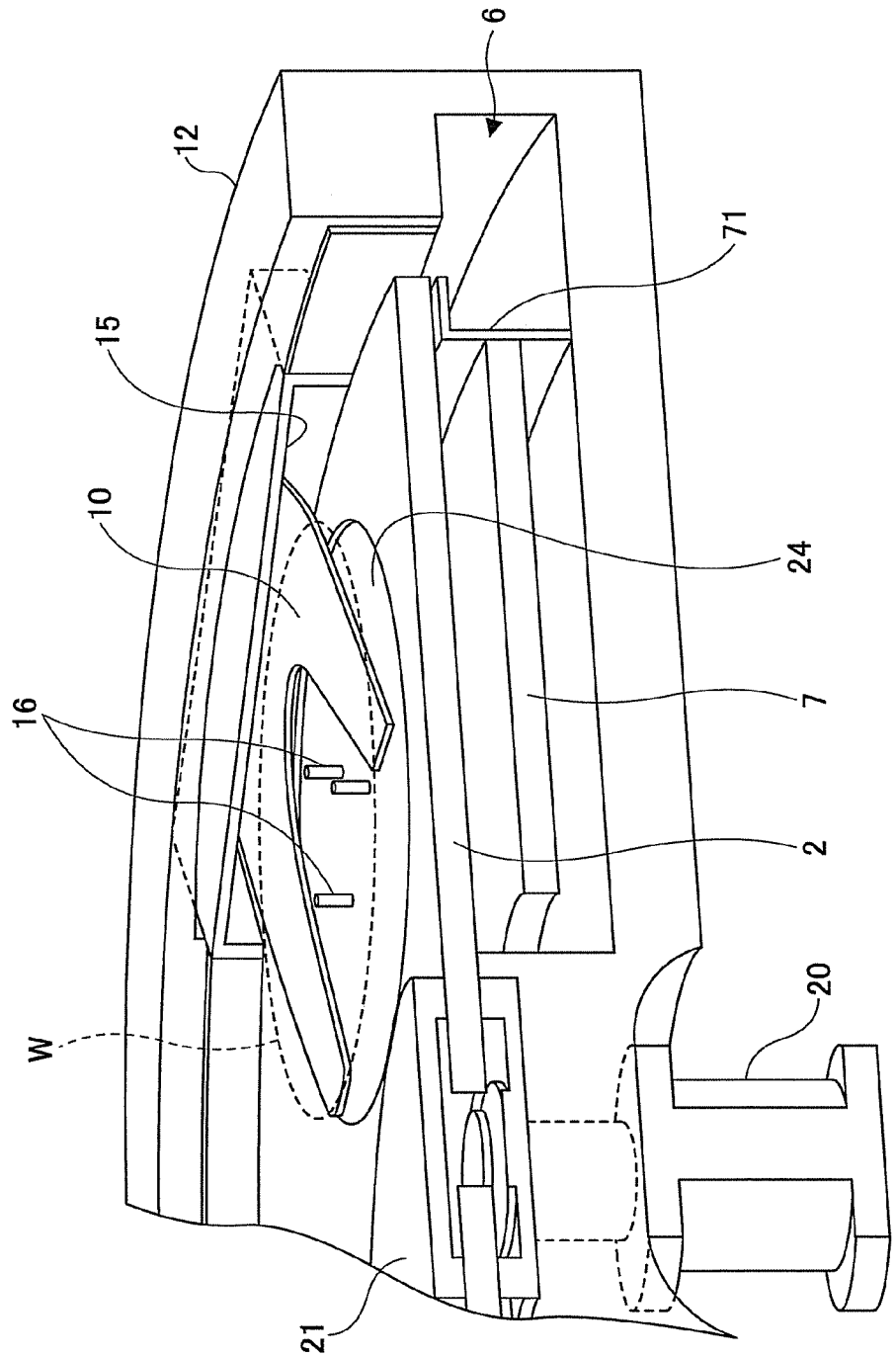
FIG. 8 is a cross-sectional and perspective view of a part of the film deposition apparatus shown in FIG. 1.

In addition, a transfer opening 15 is formed in a side wall of the chamber body 12 as shown in FIGS. 2, 3 and 8. Through the transfer opening 15, the wafer W is transferred between an outside transfer arm 10 and the rotation table 2. The transfer opening 15 is provided with a gate valve (not shown) by which the transfer opening 15 is opened or closed. When the concave part 24 (wafer providing part) of the rotation table 2 is in alignment with the transfer opening 15 and the gate valve is opened, the wafer W is transferred into the chamber 1 and placed in the concave part 24 as a wafer receiving part of the rotation table 2 from the transfer arm 10. In order to lower/raise the wafer W into/from the concave part 24, there are provided elevation pins 16 that are raised or lowered through corresponding through holes formed in the concave part 24 of the rotation table 2 by an elevation mechanism (not shown).

In addition, the film deposition apparatus according to this embodiment is provided with a control part 100 (see FIG. 1). The control part 100 is configured to control total operations of the deposition apparatus. A program for operating the apparatus is stored in a memory of the control part 100. A step group of performing the operations of the apparatus is provided in this program. This program is installed in the control part 100 from a storage medium such as a floppy disk, a memory card, an optical disk a compact disk, and a hard disk.

Next, operations of the film deposition apparatus according to this embodiment of the present invention are described. First, the gate valve (not shown) is opened so that the wafer W is delivered by the transfer arm 10 from the outside into the concave part 24 via the transfer opening 15. This delivery is performed by elevating the elevation pins 16 from the bottom part side of the vacuum chamber 1 via the piercing holes of the bottom part of the concave part 24 as shown in FIG. 8 when the concave part 24 stops in a position facing the transfer opening 15.

Such delivery of plural wafers W is performed by intermittently rotating the rotation table 2 so that one wafer W is provided in each of five concave parts 24. Next, the vacuum pump 64 is activated in order to maintain the chamber 1 at a predetermined reduced pressure. While the rotation table 2 starts rotating clockwise, the rotation table 2 is heated to a predetermined temperature (e.g., 300° C.) in advance by the heater unit 7, which in turn heats the wafers W on the rotation table 2. After the wafers W are heated and maintained at the predetermined temperature, which may be confirmed by a temperature sensor (not shown), the first reaction gas (BTBAS) is supplied to the first process area P1 through the first reaction gas nozzle 31, and the second reaction gas ($O_3$) is supplied to the second process area P2 through the second reaction gas nozzle 32. In addition, the separation gases ($N_2$) are supplied to the separation areas D through the separation nozzles 41, 42.

When the wafer W passes through the first process area P1 below the first reaction gas nozzle 31, BTBAS molecules are adsorbed on the surface of the wafer W, and when the wafer W passes through the second process area P2 below the second reaction gas nozzle 32, $O_3$ molecules are adsorbed on the surface of the wafer W, so that the BTBAS molecules are oxidized by the $O_3$ molecules. Therefore, when the wafer W passes through both areas P1, P2 with one revolution of the rotation table 2, one molecular layer of silicon dioxide is formed on the surface of the wafer W. Then, the wafers W alternate passing through areas P1, P2 plural times, and a silicon dioxide layer having a predetermined thickness is formed on the surfaces of the wafers W.

In addition, during the deposition operations above, the $N_2$ gas as the separation gas is supplied from the separation gas supplying pipe 51, and is ejected toward the top surface of the rotation table 2 from the center area C, that is, the gap 50 between the protrusion part 5 and the rotation table 2. In this embodiment, a space below the second ceiling surface 45, where the reaction gas nozzle 31 (32) is arranged, has a lower pressure than the center area C and the thin space between the first ceiling surface 44 and rotation table 2. This is because the evacuation area 6 is provided adjacent to the space below the ceiling surface 45 (see FIGS. 1 and 3) and the space is directly evacuated through the evacuation area 6; additionally, it is partly because the thin space is provided so that the height h can maintain the pressure difference between the thin space and the place where the reaction gas nozzle 31 (32) or the first (the second) process area P1 (P2) is located.

Figure 9:
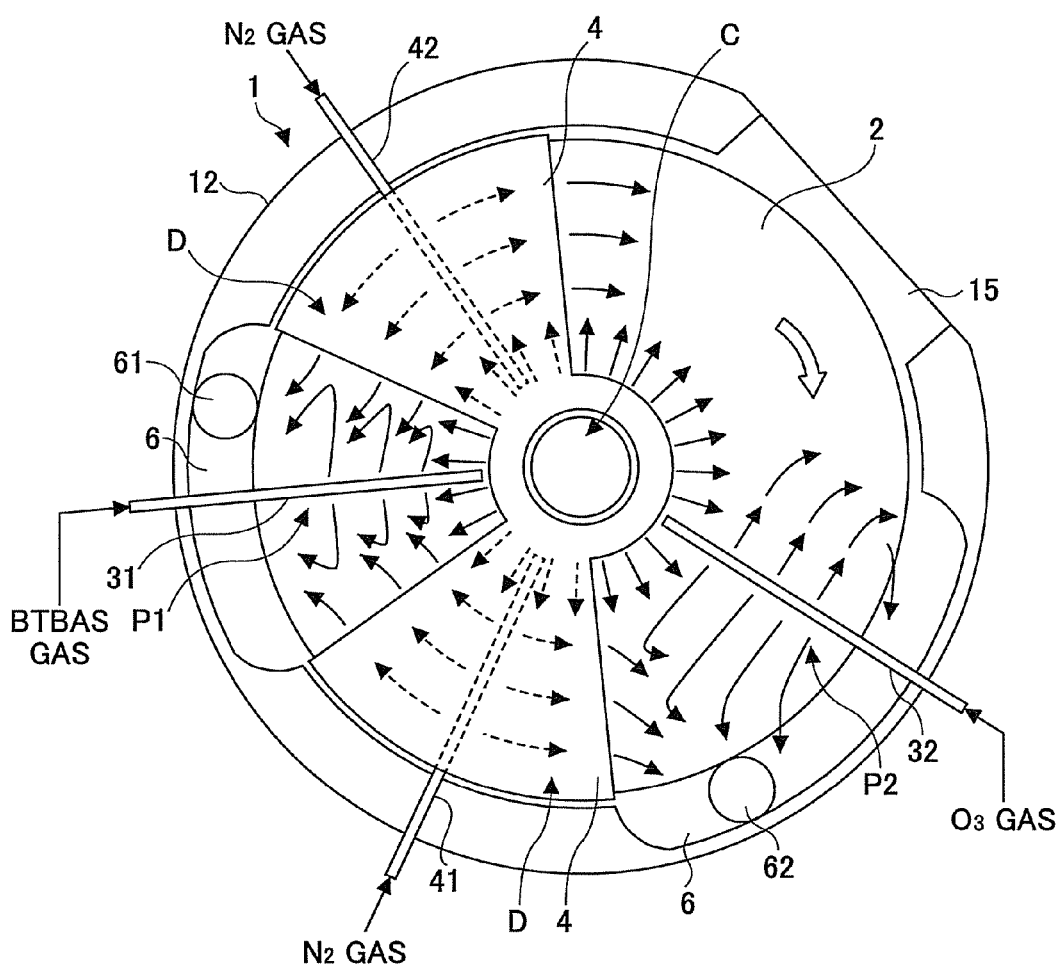
FIG. 9 is a view for explaining a state where first reaction gas and second reaction gas are separated and evacuated by the separation gas.

Next, the flow patterns of the gases supplied into the chamber 1 from the gas nozzles 31, 32, 41, 42 are described in reference to FIG. 9. Here, FIG. 9 schematically shows the flow patterns. As shown in FIG. 9, part of the $O_3$ gas ejected from the second reaction gas nozzle 32 comes in contact with and flows along the top surface of the rotation table 2 (and the surface of the wafer W) in a direction opposite to the rotation direction of the rotation table 2. Then, the $O_3$ gas is pushed back by the $N_2$ gas flowing along the rotation direction, and changes the flow direction toward the edge of the rotation table 2 and the inner circumferential wall of the chamber body 12. Finally, this part of the $O_3$ gas flows into the evacuation area 6 and is evacuated from the chamber 1 through the evacuation port 62.

Another part of the $O_3$ gas ejected from the second reaction gas nozzle 32 comes in contact with and flows along the top surface of the rotation table 2 (and the surface of the wafers W) in the same direction as the rotational direction of the rotation table 2. This part of the $O_3$ gas mainly flows toward the evacuation area 6 due to the $N_2$ gas flowing from the center part C and suction force through the evacuation port 62. On the other hand, a small part of this part of the $O_3$ gas flows toward the separation area D located downstream of the rotation direction of the rotation table 2 in relation to the second reaction gas nozzle 32 and may enter the thin space between the ceiling surface 44 and the rotation table 2. However, because the height h of the thin space is designed so that the $O_3$ gas is prevented from flowing into the thin space at film deposition conditions intended, the small part of the $O_3$ gas cannot flow into the thin space. Even when a small fraction of the $O_3$ gas flows into the thin space, the fraction of the $O_3$ gas cannot flow farther into the separation area D, because the fraction of the $O_3$ gas can be pushed backward by the $N_2$ gas ejected from the separation gas nozzle 41. Therefore, substantially all the part of the $O_3$ gas flowing along the top surface of the rotation table 2 in the rotational direction flows into the evacuation area 6 and is evacuated from the gap between the circumferential edge of the rotation table 2 and the internal circumferential wall of the vacuum chamber 1 by the evacuation port 62.

The BTBAS gas ejected from the first reaction gas nozzle 31 downward to flow to upstream and downstream sides in the rotational direction along the top surface of the rotation table 2 cannot enter a lower part of the sector-shaped convex part adjacent to the upstream and downstream sides in the rotational direction. Even if the BTBAS gas enters the lower part of the sector-shaped convex part adjacent to the upstream and downstream sides in the rotational direction, this BTBAS gas is pushed backward to the second process area P1 side and is evacuated, with the $N_2$ gas ejected from the center part C, from the gap between the circumferential edge of the rotation table 2 and the internal circumferential wall of the vacuum chamber 1 to the evacuation port 61 via the evacuation area 6. In other words, in each separation area D, the BTBAS gas or $O_3$ gas flowing as the reaction gas atmosphere is prevented from entering. On the other hand, gas molecules adhered on the surface of the wafer W pass through the separation areas Dr namely a lower part of a lower ceiling surface of the sector-shaped convex part 4 so as to contribute to deposition.

Furthermore, the BTBAS gas in the first process area P1 (the $O_3$ gas in the second process area P2) is prevented from flowing into the center area C, because the separation gas is ejected toward the outer circumferential edge of the rotation table 2 from the center area C, as shown in FIGS. 7 and 9. Even if a fraction of the BTBAS gas in the first process area P1 (the $O_3$ gas in the second process area P2) flows into the center area C, the BTBAS gas (the $O_3$ gas) is pushed backward, so that the BTBAS gas in the first process area P1 (the $O_3$ gas in the second process area P2) is prevented from flowing into the second process area P2 (the first process area P1) through the center area C.

Furthermore, the circumferential edge part of the sector-shaped convex part 4 is formed downward so that the gaps between the bent part 46 and the external edge surface of the rotation table 2 are narrow as discussed above and thereby passing of the gas is substantially prevented. Accordingly, the BTBAS gas in the first process area P1 (the $O_3$ gas in the second process area P2) is prevented from flowing into the second process area P2 (the first process area P1) through the outside of the rotation table 2. Therefore, the atmosphere of the first process area P1 and the atmosphere of the second process area P2 are completely isolated by two separation areas D. Therefore, the BTBAS gas is evacuated from the evacuation port 61, and the $O_3$ gas is evacuated from the evacuation port 62, and thus the two reaction gases are not mixed in the atmosphere or on the wafer W. In addition, the space below the rotation table 2 is purged by the $N_2$ gas supplied from the purge gas supplying pipes 72, 73. Therefore, the BTBAS gas cannot flow through below the rotation table 2 into the $O_3$ gas supplying area. Thus, the deposition process is ended.

After the deposition process is ended, each wafer is cooled by a substrate cooling part. Details of steps of substrate cooling are discussed with reference to FIG. 10. In this embodiment, the elevation pins 16 are provided under the concave part 24 of the rotation table 2. The elevation pins 16 are configured to elevate the wafer W. In this embodiment, the temperature of the wafer W just after the deposition is completed is approximately 600° C.

Figure 10:
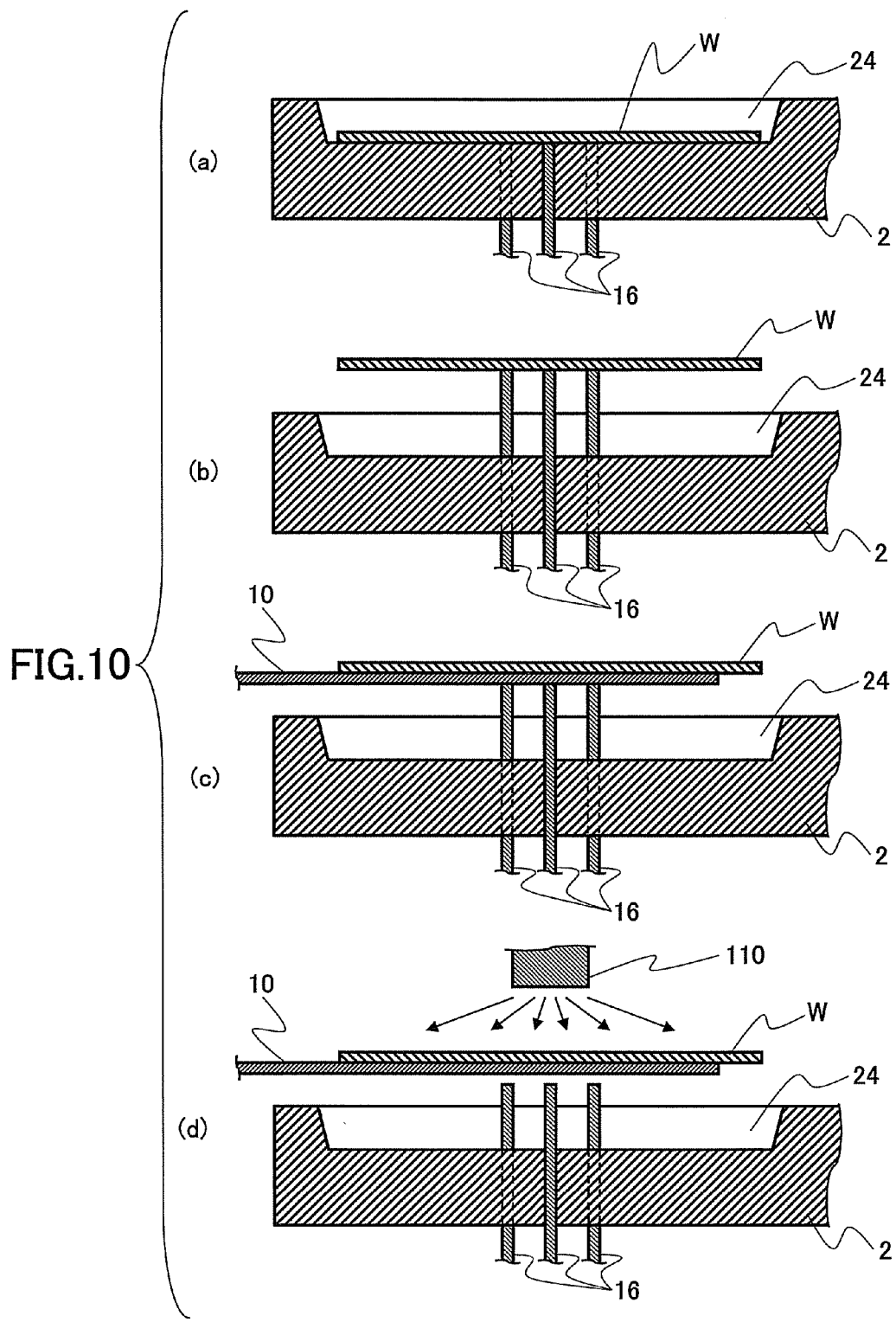
FIG. 10 is a schematic cross-sectional view showing steps of wafer cooling of the film deposition apparatus shown in FIG. 1.

FIG. 10($a$) shows a state just after the deposition is completed. In this completed state, the wafer is provided in the concave part 24 of the rotation table 2. Three elevation pins 16 as an elevating mechanism configured to elevate the wafer W are provided under the concave part 24.

Next, as shown in FIG. 10($b$), the wafer W is raised from the concave part 24 of the rotation table 2 by the elevation pins 16. The wafer W is raised to a height where the wafer can be held by the transfer arm 10.

Next, as shown in FIG. 10($c$), the wafer W raised from the concave part 24 of the rotation table 2 by the elevation pins 16 is held by the transfer arm 10 introduced from the transfer opening 15.

After this, as shown in FIG. 10($d$), after the wafer W is held by the transfer arm 10, three elevation pins 16 are lowered and the wafer is cooled by a substrate cooling part 110. More specifically, the substrate cooling part 110 includes a nozzle configured to jet nitrogen gas or inert gas and other parts. The wafer W is cooled by jetting the nitrogen gas or the like onto the wafer W. In this case, since there is a space between the wafer W and the rotation table 2, heat of the rotation table 2 is not transferred to the wafer W. Furthermore, in order to prevent thermal damage of a driving part or a driving device (not shown) configured to drive the transfer arm 10 as much as possible, it is preferable to cool the wafer W right above the concave part 24 of the rotation table 2.

After this, the wafer W is transferred from the transfer opening 15 by the transfer arm 10. Other wafers W are transferred after being cooled by the same processes.

Here, an example of process parameters is discussed. A rotational speed of the rotation table 2 is, for example, 1 rpm-500 rpm in the case of the wafer W having a diameter of 300 mm. A process pressure is, for example, 1067 Pa (8 Torr). A heating temperature of the wafer W is, for example, 350° C. A flow rate of BTBAS gas is, for example, 100 sccm, and a flow rate of $O_3$ gas is, for example, 10000 sccm. A flow rate of $N_2$ gas from the separation gas nozzles 41 and 42 is, for example, 20000 sccm. A flow rate of $N_2$ gas from the separation gas supplying pipe 51 is, for example, 5000 sccm. In addition, the number of cycles of supplying reaction gas to a single wafer, namely the number of times the wafer passes through the process areas P1 and P2, is, for example, depending on the film thickness required, 600.

According to the film deposition apparatus of this embodiment, the film deposition apparatus has the separation areas D including the low ceiling surfaces 44 between the first process area P1, to which the BTBAS gas is supplied from the first reaction gas nozzle 31, and the second process area P2, to which the $O_3$ gas is supplied from the second reaction gas nozzle 32. Accordingly, the BTBAS gas (the $O_3$ gas) is prevented from flowing into the second process area P2 (the first process area P1) and being mixed with the $O_3$ gas (the BTBAS gas). Therefore, an MLD (or ALD) mode deposition of silicon dioxide is assuredly performed by rotating the rotation table 2 on which the wafers W are placed in order to allow the wafers W to pass through the first process area P1, the separation area D, the second process area P2, and the separation area D. In addition, the separation areas D further include the separation gas nozzles 41 and 42 from which the $N_2$ gases are ejected in order to further securely prevent the BTBAS gas (the $O_3$ gas) from flowing into the second process area P2 (the first process area P1) and being mixed with the $O_3$ gas (the BTBAS gas). Furthermore, the vacuum chamber 1 of the film deposition apparatus according to this embodiment has the center area C having the ejection holes from which the $N_2$ gas is ejected. Therefore, the BTBAS gas (the $O_3$ gas) is prevented from flowing into the second process area P2 (the first process area P1) through the center area C and being mixed with the $O_3$ gas (the BTBAS gas). Furthermore, since the BTBAS gas and the $O_3$ gas are not mixed, almost no depositions of silicon dioxide are made on the rotation table 2, thereby reducing particle problems.

In the meantime, although the rotation table 2 has the five concave parts 24 and five wafers W placed in the corresponding concave parts 24 can be processed in a single run in this embodiment, only a single wafer W may be placed in one of the five concave parts 24, or the rotation table 2 may have only a single concave part 24.

The reaction gases that may be used in the film deposition apparatus of the embodiment of the present invention are dichlorosilane (DOCS), hexachlorodisilane (HCD), Trimethyl Aluminum (TMA) tris(dimethyl amino)silane (3DMAS), tetrakis-ethyl-methyl-amino-hafnium (TEMHf), bis(tetra methyl heptandionate)strontium ($Sr(THD)_2$), (methyl-pentadionate)(bis-tetra-methyl-heptandionate)titanium (Ti(MPD)(THD)), monoamino-silane, or the like.

A larger centrifugal force is applied to the gases in the chamber 1 at a position closer to the outer circumference of the rotation table 2, so that the BTBAS gas, for example, flows toward the separation area D at a higher speed in the position closer to the outer circumference of the rotation table 2. Therefore, the BTBAS gas is more likely to enter the thin space between the ceiling surface 44 and the rotation table 2 in the position closer to the circumference of the rotation table 2. Because of this situation, when the convex part 4 has a greater width (a longer arc) toward the circumference, the BTBAS gas cannot flow farther into the thin space to be mixed with the $O_3$ gas. On this point, it is preferable for the convex part 4 to have a sector-shaped top view, as explained in the above embodiment.

Figure 11:
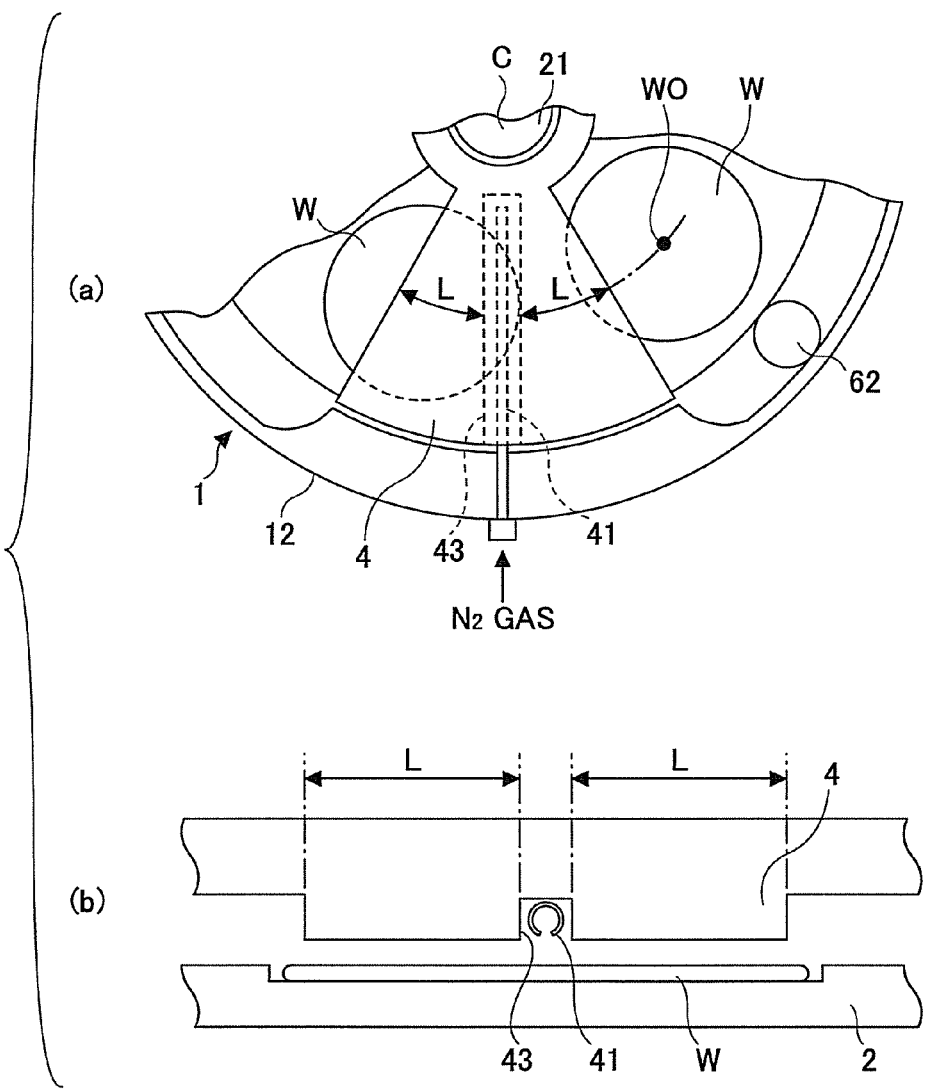
FIG. 11 is a view for explaining an example of dimensions of a convex part used for the separation area.

The size of the convex part 4 (or the ceiling surface 44) is exemplified again below. Referring to FIG. 11(*a*) and FIG. 11(*b*), the ceiling surface 44 that creates the thin space in both sides of the separation gas nozzle 41 (42) may preferably have a length L ranging from approximately one-tenth of the diameter of the wafer W through approximately the diameter of the wafer W, preferably, approximately one-sixth or more of the diameter of the wafer W along an arc that corresponds to a route through which a wafer center WO passes. Specifically, the length L is preferably equal to or greater than approximately 50 mm in a case where the wafer W has a diameter of 300 mm. When the length L is short, the height h of the thin space between the ceiling surface 44 and the rotation table 2 (wafer W) has to be accordingly small in order to effectively prevent the reaction gases from flowing into the thin space. However, when the length L becomes too small and thus the height h has to be extremely small, the rotation table 2 may hit the ceiling surface 44, which may cause wafer breakage and wafer contamination through particle generation. Therefore, measures to dampen the vibration of the rotation table 2 or measures to stably rotate the rotation table 2 are required in order to avoid the rotation table 2 hitting the ceiling surface 44. On the other hand, when the height h of the thin space is kept relatively greater while the length L is small, the rotational speed of the rotation table 2 has to be lower in order to avoid the reaction gases flowing into the thin space between the ceiling surface 44 and the rotation table 2, which is rather disadvantageous in terms of production throughput. From these considerations, the length L of the ceiling surface 44 along the arc corresponding to the route of the wafer center WO is preferably equal to or greater than approximately 50 mm. However, the size of the convex part 4 or the ceiling surface 44 is not limited to the above size, but may be adjusted depending on the process parameters and the size of the wafer to be used. In addition, as can be clearly understood from the above explanation, the height h of the thin space may be adjusted depending on an area of the ceiling surface 44 in addition to the process parameters and the size of the wafer to be used, as long as the thin space has a height h that allows the separation gas to flow from the separation area D through the process area P1 (P2).

Figure 12:
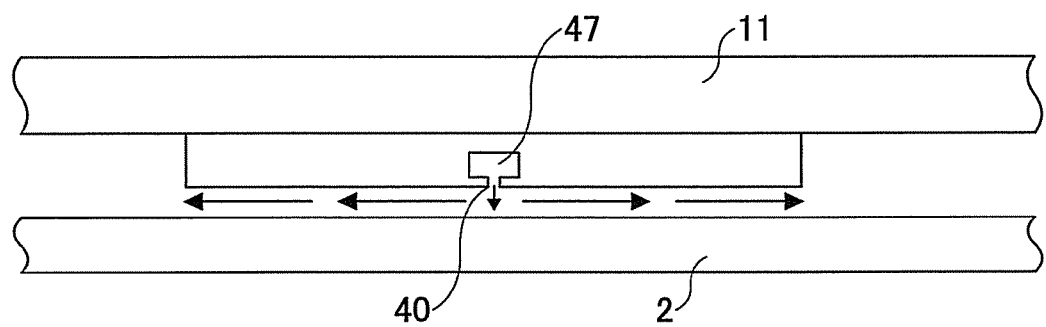
FIG. 12 is a vertical cross-sectional view of another example of the separation area.

The separation gas nozzle 41 (42) is located in the groove part 43 formed in the convex part 4 and the lower ceiling surfaces 44 are located on both sides of the separation gas nozzle 41 (42) in the above-discussed embodiment. However, as shown in FIG. 12, a flow path 47 extending along the radial direction of the rotation table 2 may be made inside the convex part 4, instead of the separation gas nozzle 41 (42). Plural of the ejection holes 40 may be formed along the longitudinal direction of the flow path 47 so that the separation gas ($N_2$ gas) may be ejected from the plural holes 40 in other embodiments.

Figure 13:
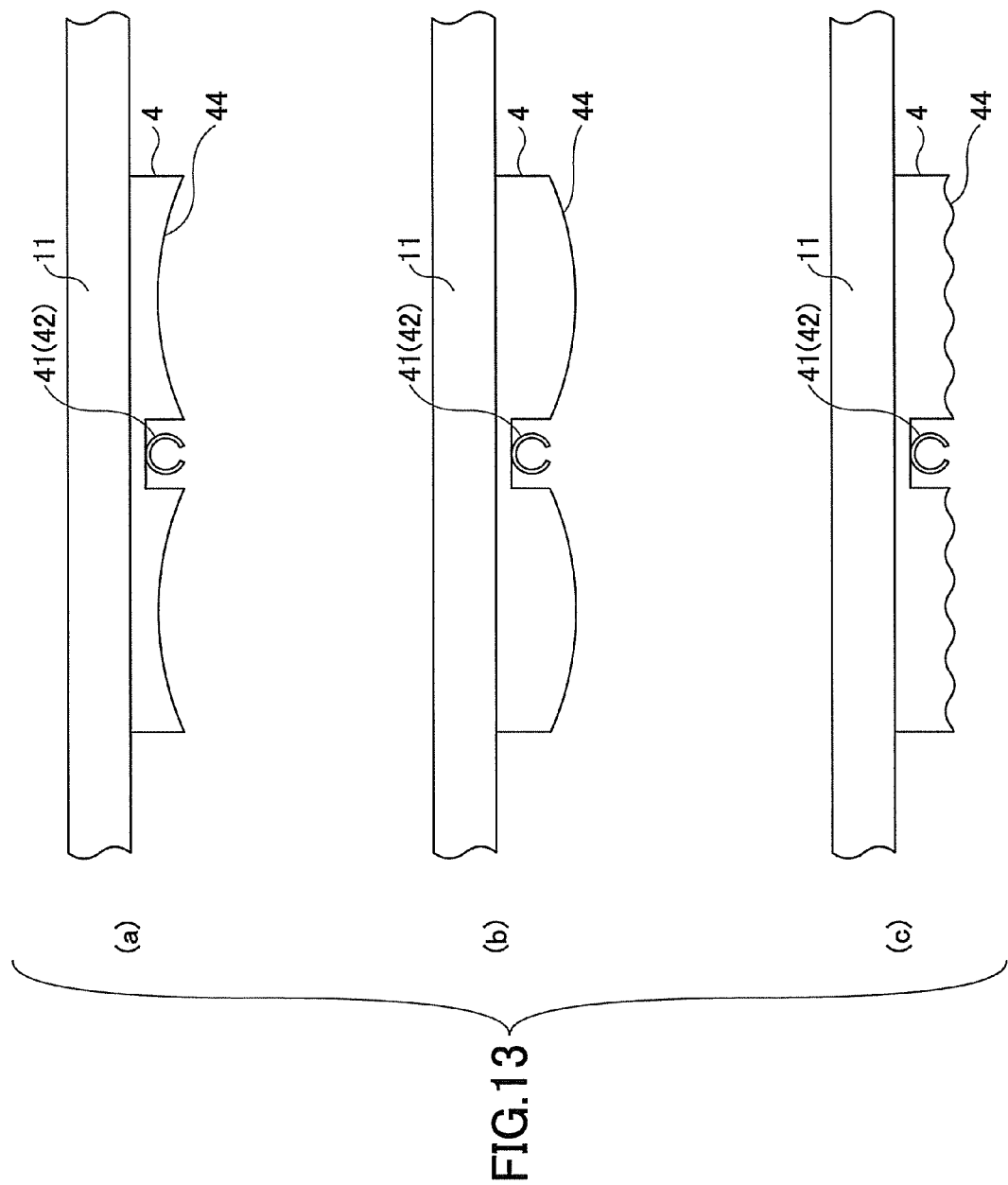
FIG. 13 is a vertical cross-sectional view showing another example of the convex part used for the separation area.

The ceiling surface 44 of the separation area D is not always necessarily flat. For example, the ceiling surface 44 may be concavely curved as shown in FIG. 13(*a*), convexly curved as shown in FIG. 13(*b*), or corrugated as shown in FIG. 13(*c*).

In addition, the convex part 4 may be hollow and the separation gas may be introduced into the hollow convex part 4. In this case, the plural gas ejection holes 33 may be arranged as shown in FIG. 14(*a*), FIG. 14(*b*) and FIG. 14(*c*).

Figure 14:
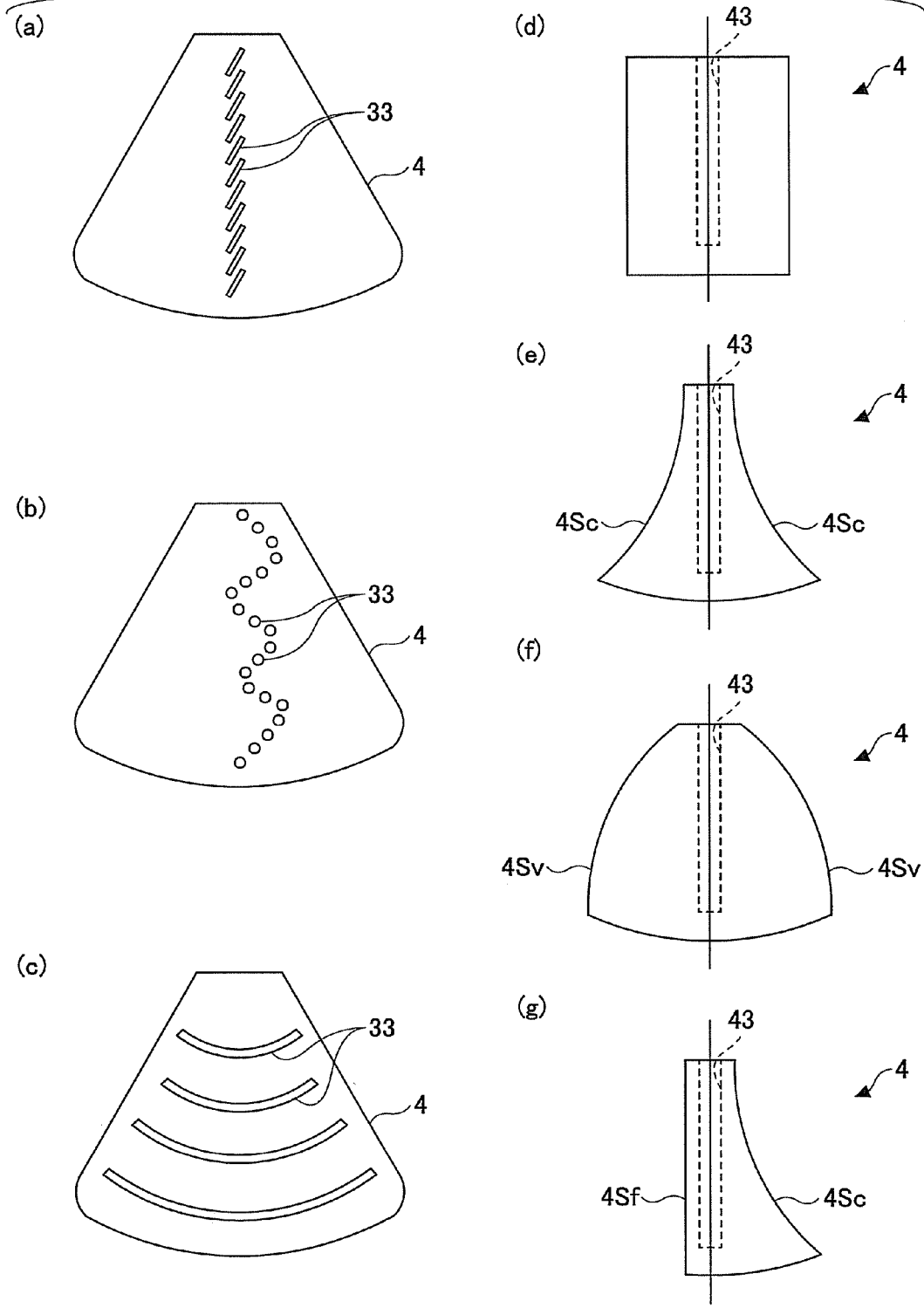
FIG. 14 is a bottom view of another example of a gas ejecting hole of a reaction gas supplying part.

In an example shown in FIG. 14(*a*), the plural gas ejection holes 33 each have a shape of a slanted slit relative to a diameter of the rotation table 2. These slanted slits (gas ejection holes 33) are arranged to be partially overlapped with an adjacent slit along the radial direction of the rotation table 2.

In an example shown in FIG. 14(*b*), the plural gas ejection holes 33 are circular. These circular holes (gas ejection holes 33) are arranged along a serpentine line that extends in the radial direction as a whole.

In an example shown in FIG. 14(*c*), each of the plural gas ejection holes 33 has the shape of an arc-shaped slit. These arc-shaped slits (gas ejection holes 33) are arranged at predetermined intervals in the radial direction.

While the convex part 4 has the sector-shaped top view shape in this embodiment, the convex part 4 may have a rectangular top view shape as shown in FIG. 14(*d*), or a square top view shape in other embodiments. Alternatively, the convex part 4 may be sector-shaped as a whole in the top view and have concavely curved side surfaces 4Sc, as shown in FIG. 14(*e*). In addition, the convex part 4 may be sector-shaped as a whole in the top view and have convexly curved side surfaces 4Sv, as shown in FIG. 14(*f*). Moreover, an upstream part of the convex part 4 relative to the rotational direction of the rotation table 2 (FIG. 1) may have a concavely curved side surface 4Sc and a downstream part of the convex part 4 relative to the rotational direction of the rotation table 2 (FIG. 1) may have a flat side surface 4Sf, as shown in FIG. 14(*g*). Dotted lines in FIG. 14(*d*) through FIG. 14(*g*) represent the groove parts 43. In these cases, the separation gas nozzle 41 (42), which is housed in the groove part 43, extends from the center part of the chamber 1, for example, from the protrusion part 5.

The heater unit 7 which heats the wafers W may be configured to have a lamp heating element instead of the resistance heating element. In addition, the heater unit 7 may be located above the rotation table 2, or above and below the rotation table 2.

Figure 15:
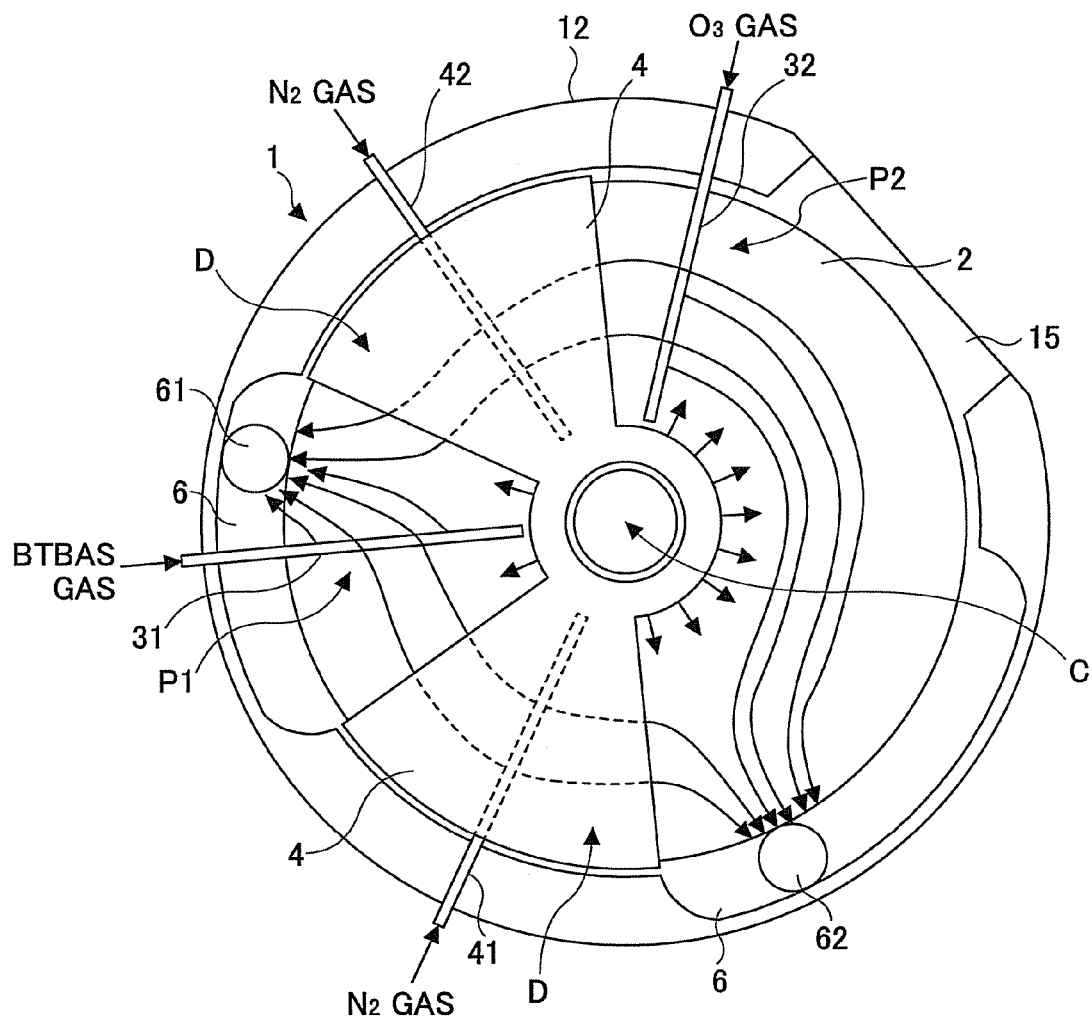
FIG. 15 is a horizontal plan view of a film deposition apparatus of another embodiment of the present invention.

The process areas P1 and P2 and the separation area D may be arranged in other embodiments, as shown in FIG. 15. Referring to FIG. 15, the second reaction gas nozzle 32 configured to supply the second reaction gas (e.g., O$_3$ gas) is located upstream of the rotational direction relative to the transfer opening 15. In this case, the same effect can be achieved.

Figure 16:
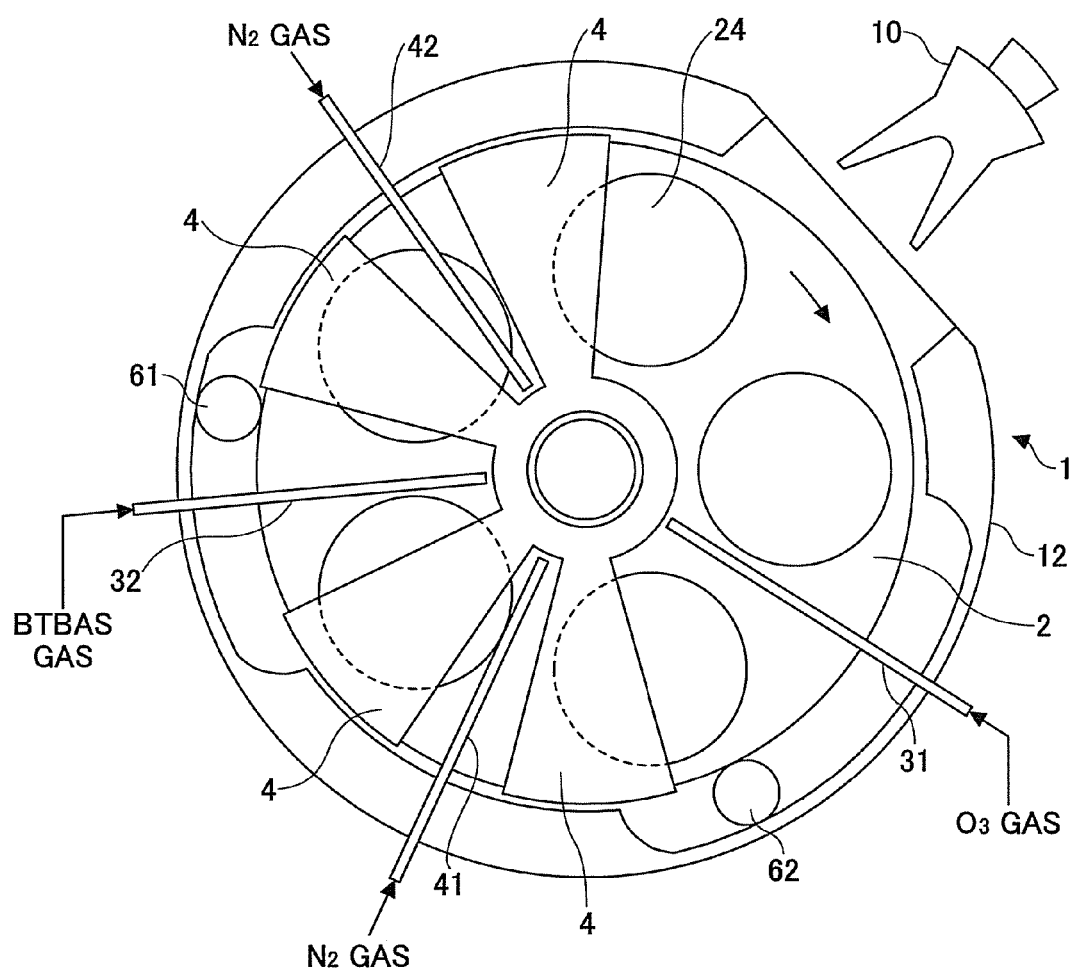
FIG. 16 is a horizontal plan view of a film deposition apparatus of another embodiment of the present invention.

As discussed above, in the separation area D, the sector-shaped convex part 4 may be divided into two parts in the circumferential direction and the separation gas nozzle 41 (42) may be provided between the two parts. FIG. 16 shows an example of such a structure. In this case, a distance between the sector-shaped convex part 4 and the separation gas nozzle 41 (42) or a size of the sector-shaped convex part 4 is determined, considering the ejected flow amount of the separation gas or the reaction gas, so that the separation area D can achieve effective separation action.

Figure 17:
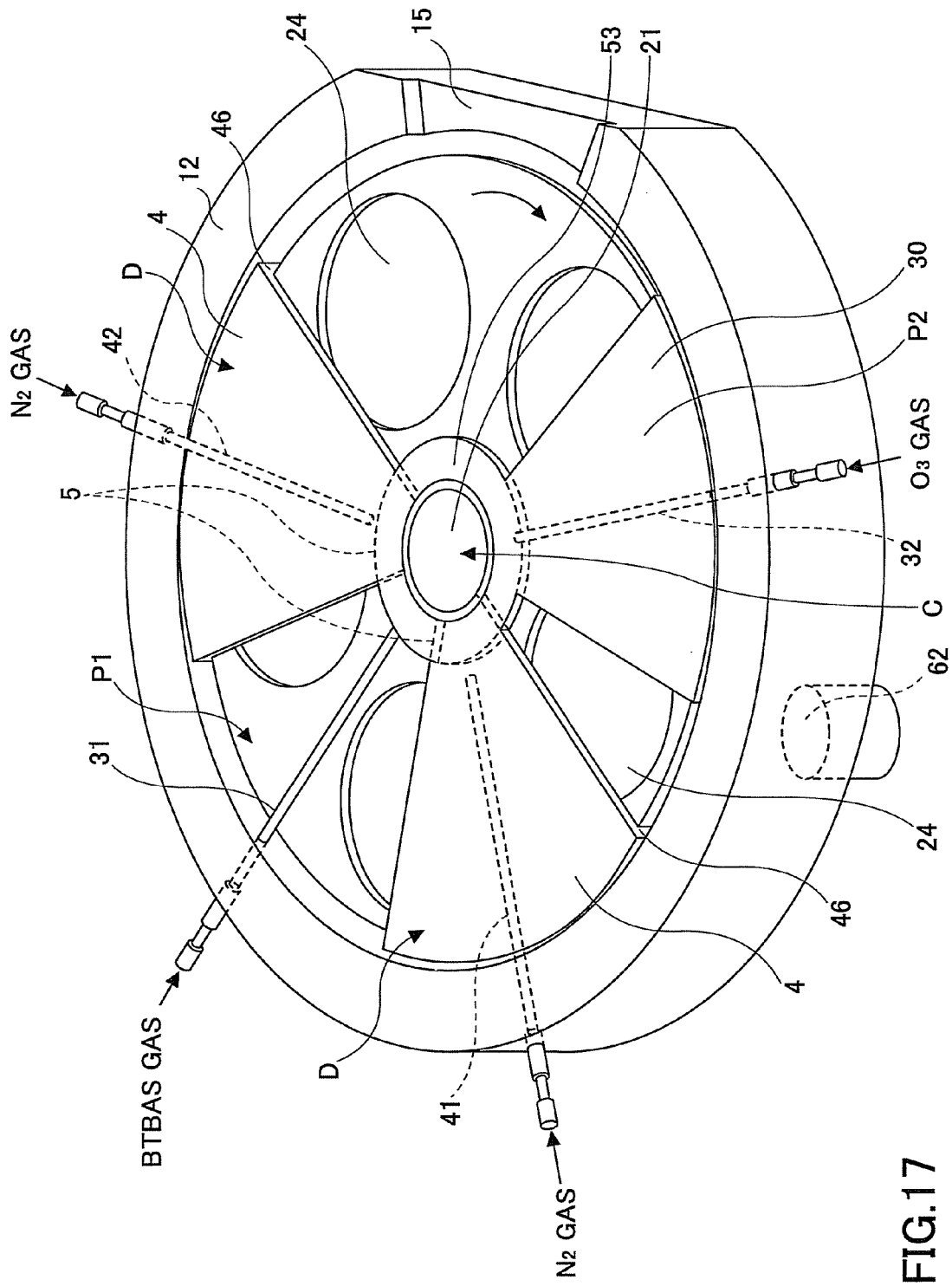
FIG. 17 is a perspective view of a schematic structural view of the inside of a film deposition apparatus of another embodiment of the present invention.

In the above embodiment, the first process area P1 and the second process area P2 correspond to the areas having the ceiling surface 45 higher than the ceiling surface 44 of the separation area D. However, at least one of the first process area P1 and the second process area P2 may have another ceiling surface that opposes the rotation table 2 on both sides of the reaction gas supplying nozzle 31 (32) and is lower than the ceiling surface 45 in order to prevent gas from flowing into a gap between the ceiling surface concerned and the rotation table 2. This ceiling surface, which is lower than the ceiling surface 45, may be as low as the ceiling surface 44 of the separation area D. FIG. 17 shows an example of such a structure. As shown in FIG. 17, a sector-shaped convex part 30 is located in the second process area P2, where O$_3$ gas is adsorbed on the wafer W, and the reaction gas nozzle 32 is located in the groove part (not shown in FIG. 17) formed in the convex part 30. In other words, this second process area P2 shown in FIG. 17 is configured in the same manner as the separation area D, while the gas nozzle is used in order to supply the reaction gas. In addition, the convex part 30 may be configured as a hollow convex part, an example of which is illustrated in FIGS. 14(*a*) through 14(*c*).

Figure 18:
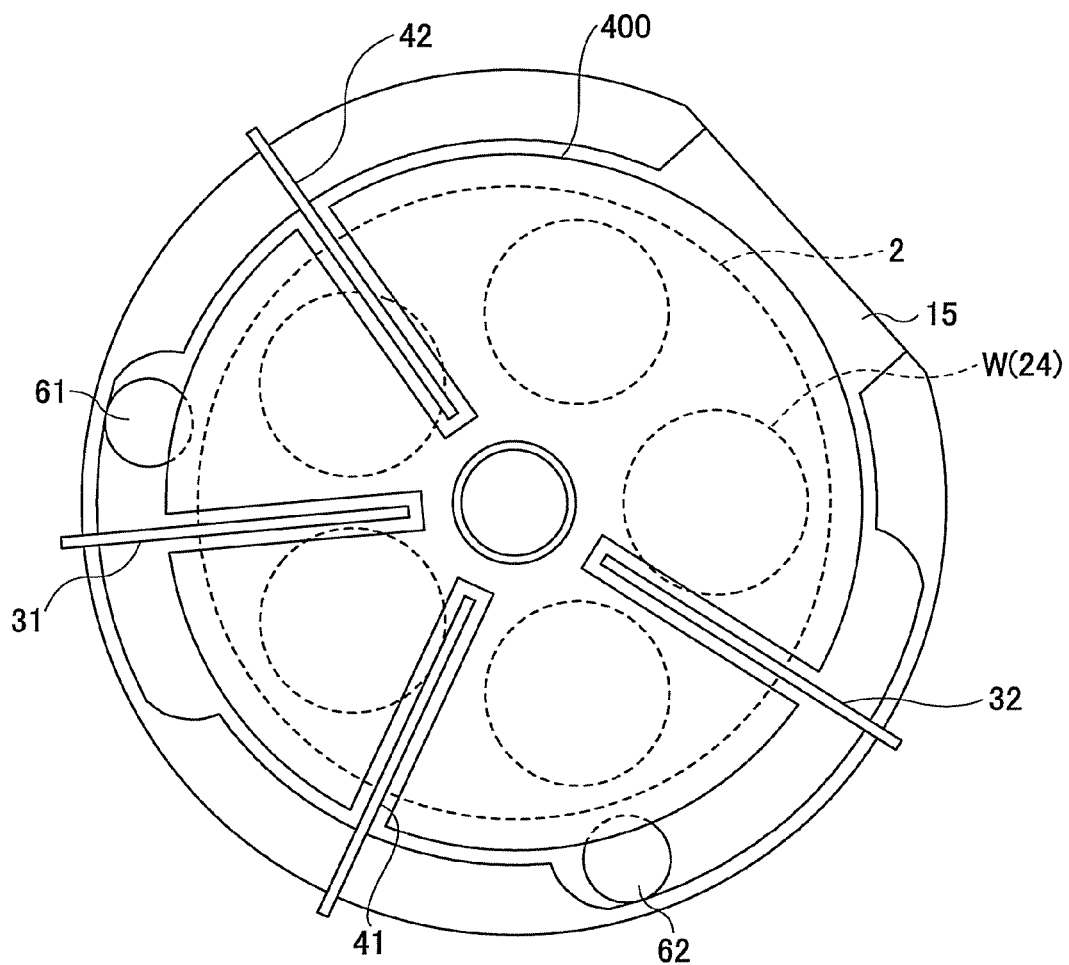
FIG. 18 is a horizontal plan view of a film deposition apparatus of another embodiment of the present invention.

In addition, as long as the low ceiling surfaces 44 are provided on both sides of the reaction gas nozzle 41 (42) for making the thin space, in other embodiments as shown in FIG. 18, the ceiling surface, which is lower than the ceiling surface 45 and as low as the ceiling surface 44 of the separation area D, may be provided for both reaction gas nozzles 31, 32 and extended to reach the ceiling surfaces 44. In other words, another convex part 400 may be attached on the lower surface of the ceiling plate 11, instead of the convex part 4. The convex part 400 has a shape of a substantially circular plate, opposes substantially the entire top surface of the rotation table 2, and has four slots 400*a* where the corresponding gas nozzles 31, 32, 41, and 42 are housed. The slots 400*a* extend in a radial direction. The convex part 400 leaves a thin space below the convex part 400 in relation to the rotation table 2.

A height of the thin space may be comparable with the height h stated above. When the convex part 400 is employed, the reaction gas ejected from the reaction gas nozzle 31 (32) diffuses to both sides of the reaction gas nozzle 31 (32) below the convex part 400 (or in the thin space). The separation gas ejected from the separation gas nozzle 41 (42) diffuses to both sides of the separation gas nozzle 41 (42). The reaction gas and the separation gas flow into each other in the thin space and are evacuated through the evacuation port 61 (62). Even in this case, the reaction gas ejected from the reaction gas nozzle 31 cannot be mixed with the other reaction gas ejected from the reaction gas nozzle 32, thereby realizing a proper ALD (or MLD) mode film deposition.

The convex part 400 may be configured by combining the hollow convex parts 4 shown in any of FIG. 14(*a*) through FIG. 14(*c*) in order to eject the reaction gases and the separation gases from the corresponding ejection holes 33 in the corresponding hollow convex parts 4 without using the gas nozzles 31, 32, 41, 42 and the slits 400*a*.

Figure 19:
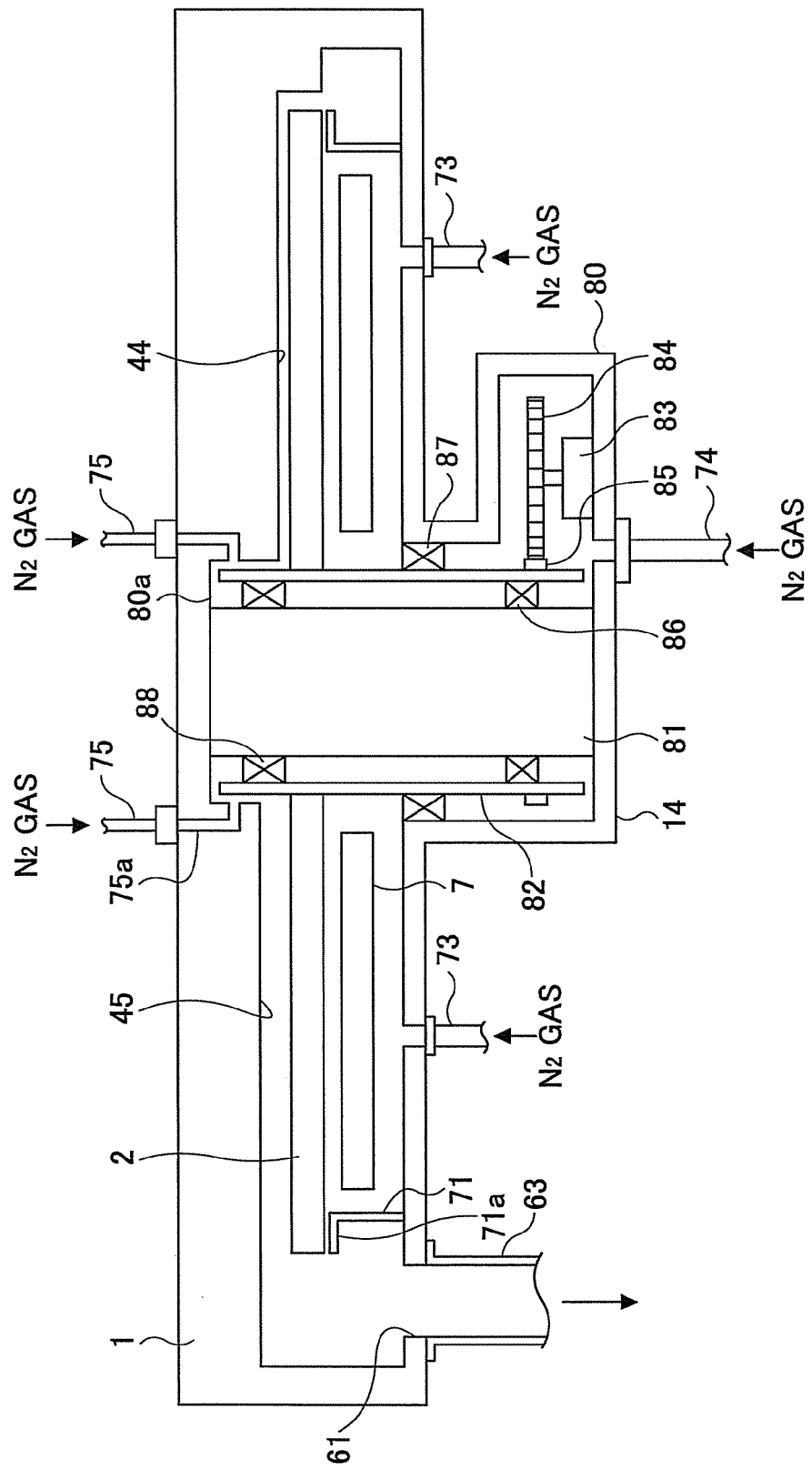
FIG. 19 is a vertical plan view of a film deposition apparatus of another embodiment of the present invention.
Figure 20:
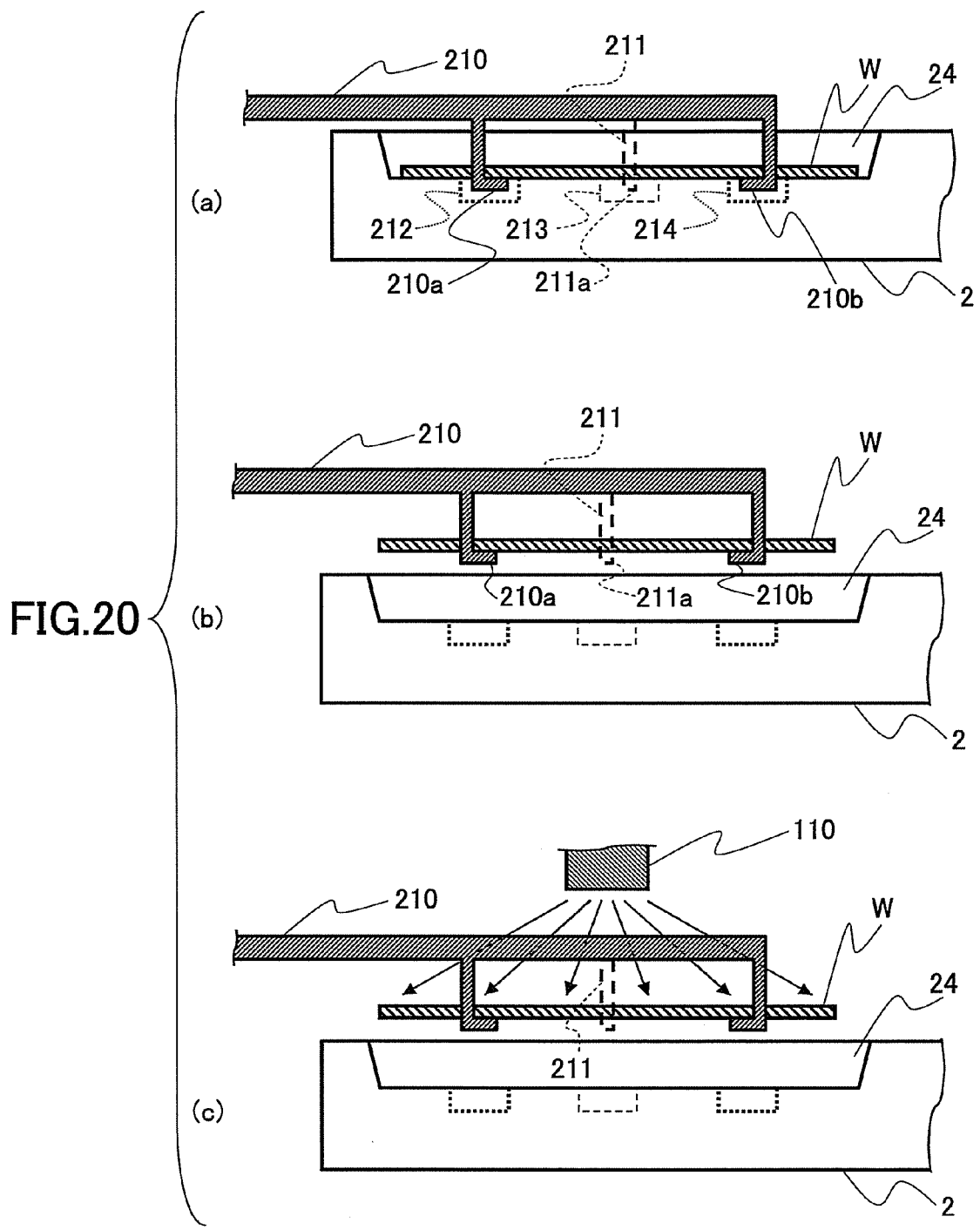
FIG. 20 is a cross-sectional view showing steps of wafer cooling of a film deposition apparatus of another embodiment of the present invention.
Figure 21:
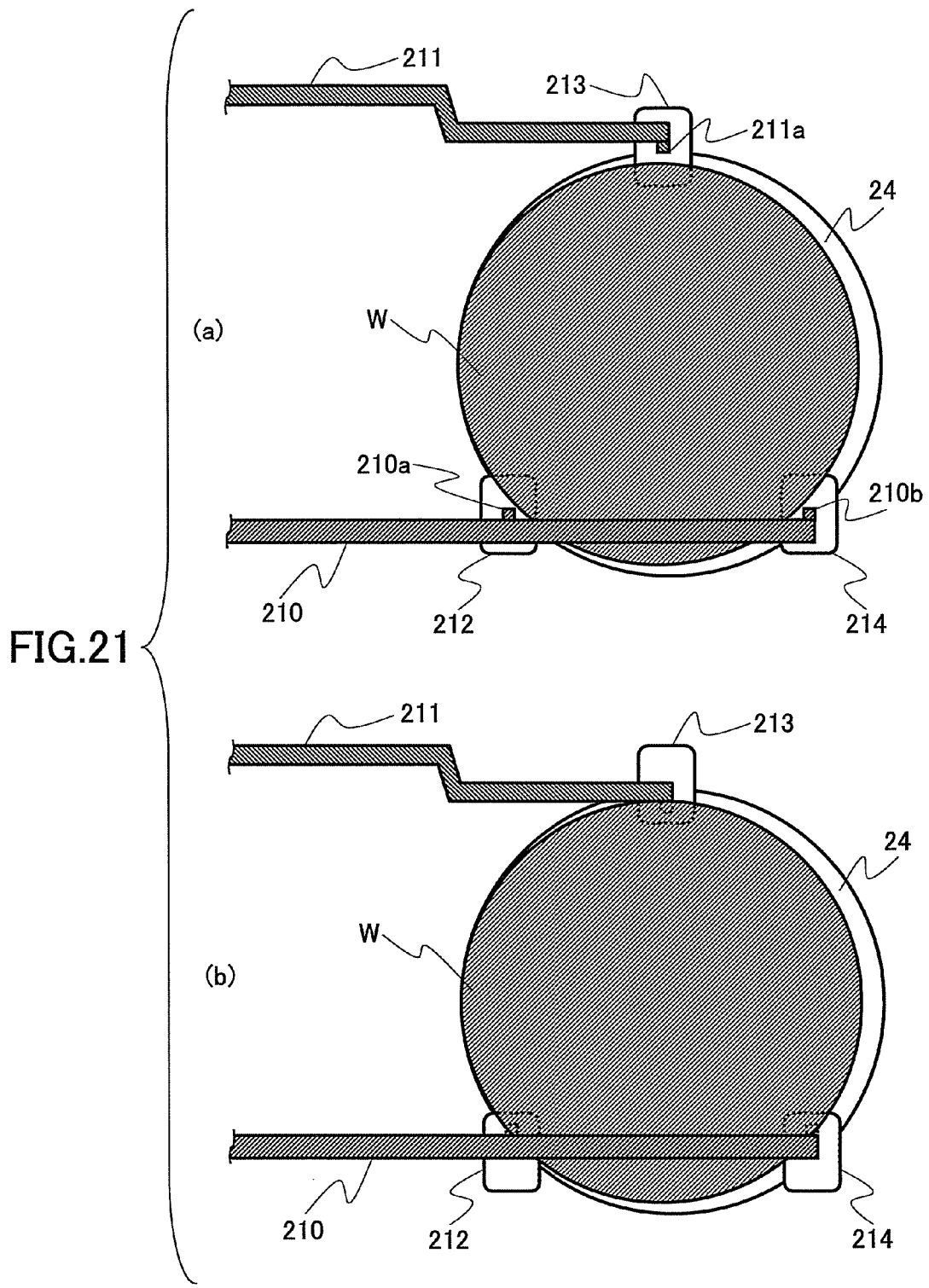
FIG. 21 is an upper view showing the steps of wafer cooling of the film deposition apparatus of another embodiment of the present invention.

In the above embodiments, the rotation shaft 22 configured to rotate the rotation table 2 is located in the center part of the chamber 1. In addition, the space between the center part of the rotation table 2 and the upper surface of the vacuum chamber 1 is purged with the separation gas. However, the chamber 1 may be configured as shown in FIG. 19 in other embodiments. Referring to FIG. 19, the bottom part 14 in the center area of the vacuum chamber 1 projects downward so that a receiving space configured to receive the driving part is formed. In addition, a concave part 80*a* is formed in the upper surface of the center area of the vacuum chamber 1. In the center part of the vacuum chamber 1, a pillar 81 is placed on the bottom surface of the housing case 80, and a top end part of the pillar 81 reaches a bottom surface of the center concave part 80*a*. The pillar 81 can prevent the first reaction gas (BTBAS) ejected from the first reaction gas nozzle 31 and the second reaction gas (O$_3$) ejected from the second reaction gas nozzle 32 from being mixed through the center part of the chamber 1.

In additions a rotation sleeve 82 is provided so that the rotation sleeve 82 coaxially surrounds the pillar 81. The rotation sleeve 82 is supported by bearings 86, 88 attached on an outer surface of the pillar 81 and a bearing 87 attached on an inner side wall of the housing case 80. Moreover, the rotation sleeve 82 has a gear part 85 formed or attached on an outer surface of the rotation sleeve 82. Furthermore, an inner circumference of the ring-shaped rotation table 2 is attached on the outer surface of the rotation sleeve 82. A driving part 83 is housed in the housing case 80 and has a gear 84 attached to a shaft extending from the driving part 83. The gear 84 is meshed with the gear part 85. With such a configuration, the rotation sleeve 82 and thus the rotation table 2 are rotated by the driving part 83.

A purge gas supplying pipe 74 is connected to an opening formed in a bottom of the housing case 80, so that a purge gas is supplied into the housing case 80. With this, an inner space of the housing case 80 may be kept at a higher pressure than an inner space of the chamber 1, in order to prevent the reaction gases from flowing into the housing case 80. Therefore, no film deposition takes place in the housing case 80, thereby reducing maintenance frequency. In addition, purge gas supplying pipes 75 are connected to corresponding flow paths 75a that reach from an upper outer surface of the chamber 1 to an inner side wall of the concave part 80a, so that a purge gas is supplied toward an upper end part of the rotation sleeve 82. Because of the purge gas, the BTBAS gas and the $O_3$ gas cannot be mixed through a space between the outer surface of the rotation sleeve 82 and the side wall of the concave part 80a. Although the openings (the purge gas supplying openings) configured to supply the purge gas to the space between the side surface of the concave part 80a and an end part of the rotation sleeve 82 are provided at two parts (left and right) in the example shown in FIG. 19, it is preferable to determine the number of the openings (the purge gas supplying openings) so that the BTBAS gas and the $O_3$ gas are not mixed in the vicinity of the rotation sleeve 82.

In the embodiment illustrated in FIG. 19, as seen from the rotation table 2 side, a space between the side wall of the concave part 80a and the upper end part of the rotation sleeve 82 corresponds to the ejection hole for ejecting the separation gas. In addition, the center area is configured with the ejection hole, the rotation sleeve 82, and the pillar 81.

Next, another embodiment with respect to a method of cooling the wafer W is discussed. This method is called an upper holding method. Details of steps of this method are discussed with reference to FIG. 20 and FIG. 21. In this embodiment as well as the embodiment discussed above, the temperature of the wafer W after the deposition is completed is approximately 600° C.

First, as shown in FIG. 20(a), upper holding arms 210 and 211 including two stick-shaped holding parts are introduced from the transfer opening 15 so that the wafer W is held at the concave part 24 of the rotation table 2. More specifically, after the upper holding arms 210 and 211 are moved to the concave part 24 of the rotation table 2, the upper holding arms 210 and 211 are lowered. The upper holding arm 210 includes wafer contact parts 210a and 210b as claw-shaped wafer holding parts. The upper holding arm 211 includes a wafer contact part 211a as a claw-shaped wafer holding part. Deep concave parts 212, 213, and 214 are provided so that the wafer contact parts 210a, 210b, and 211a do not come in contact with the rotation table 2 after the upper holding arms 210 and 211 are lowered above the concave part 24 of the rotation table 2. Depths of the concave parts 212, 213, and 214 are greater than the depth of the concave part 24 of the rotation table 2.

The upper holding arms 210 and 211 can not only move in upper and lower directions and a radial direction of the rotation table 2 but can also make the space between the upper holding arms 210 and 211 narrow or wide in a vertical direction on this drawing. By this operation, the wafer W is held. More specifically, as shown in FIG. 21(a), after the upper holding arms 210 and 211 are lowered so that the wafer contact parts 210a, 210b, and 211a do not come in contact with the wafer W, the space between the upper holding arms 210 and 211 is made narrow so that the wafer W is held as shown in FIG. 21(b).

Next, as shown in FIG. 20(b), the upper holding arms 210 and 211 are raised so that the wafer W is taken up from the concave part 24 of the rotation table 2.

Next, as shown in FIG. 20(c), the wafer W is cooled by the wafer cooling part 110. More specifically, the wafer cooling part 110 includes a nozzle configured to jet nitrogen gas or inert gas and other parts. The nitrogen gas or the like is jetted onto the wafer W so that the wafer W is cooled. At this time, since there is a space between the wafer W and the rotation table 2, the heat of the rotation table 2 is not transferred to the wafer W. Furthermore, in order to prevent the thermal damage of a driving part or a driving device (not shown) configured to drive the upper holding arms 210 and 211 as much as possible, it is preferable to perform cooling of the wafer W just above the concave part 24 of the rotation table 2.

After this, the wafer W is transferred from the transfer opening 15 by the upper holding arms 210 and 211. Other wafers W are transferred after being cooled by the same processes.

Although three wafer contact parts 210a, 210b, and 211a are provided at the upper holding arms 210 and 211 in this embodiment, four or more wafer contact parts may be provided.

Although two kinds of reaction gases are used in the film deposition apparatus according to the above embodiment, three or more kinds of reaction gases may be used in other film deposition apparatuses according to other embodiments of the present invention. In this case, a first reaction gas nozzle, a separation gas nozzle, a second reaction gas nozzle, a separation gas nozzle, and a third reaction gas nozzle may be located in this order at predetermined angular intervals, each nozzle extending along the radial direction of the rotation table 2. Additionally, the separation areas D including the corresponding separation gas nozzles are configured the same as explained above.

Figure 22:
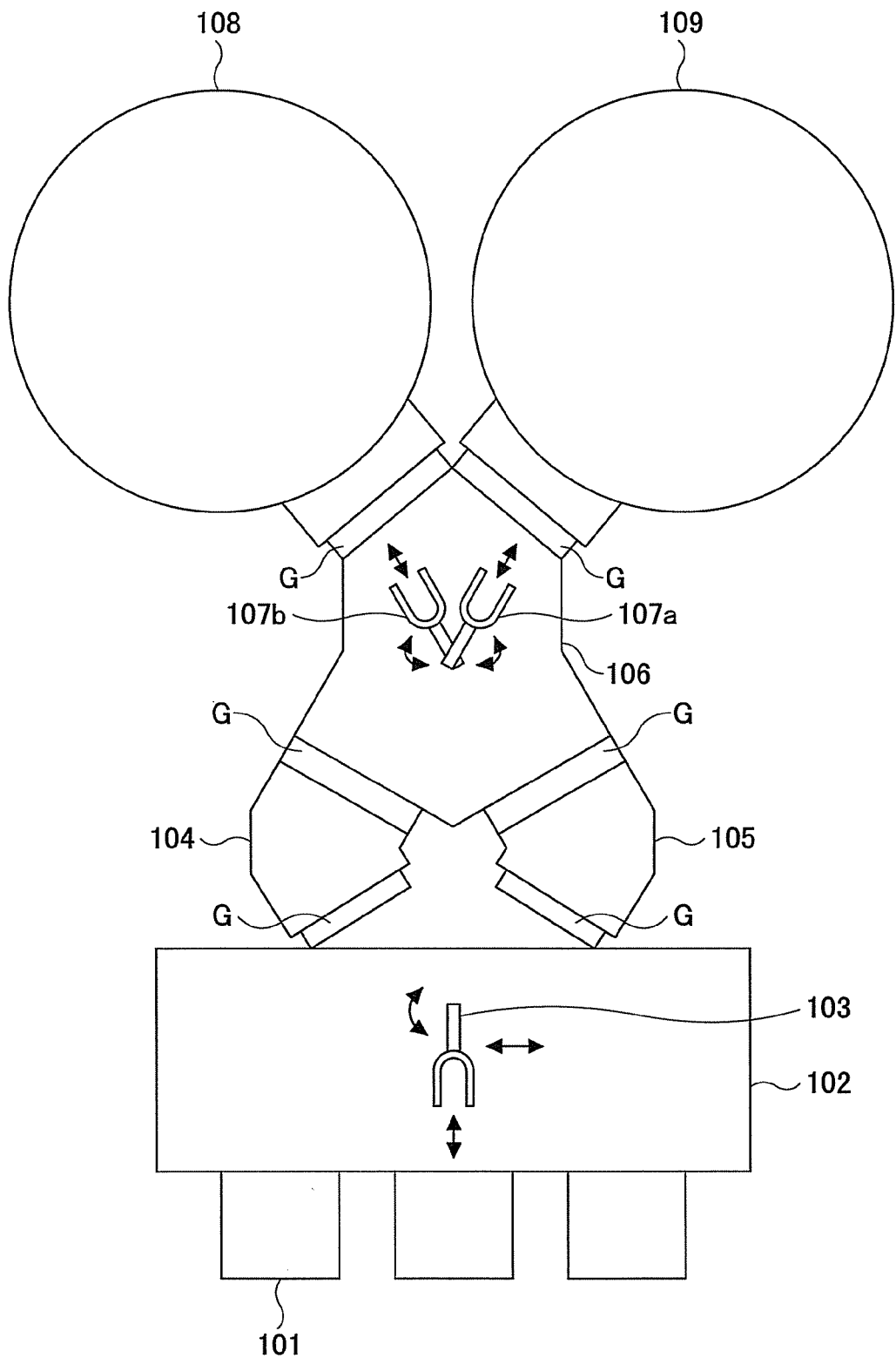
FIG. 22 is a plan view showing an example of a substrate process system using the film deposition apparatus of the embodiments of the present invention.

The film deposition apparatus according to embodiments of the present invention may be integrated into a substrate process apparatus, an example of which is schematically illustrated in FIG. 22. The substrate process apparatus includes a hermetic type wafer transfer cassette 101 called a Front Opening Unified Pod (FOUP) where, for example 25 pieces of the wafers, an atmospheric transfer chamber 102 in which a transfer arm 103 is provided, load lock chambers (preparatory vacuum chambers) 104 and 105 whose atmospheres are changeable between vacuum and atmospheric pressure, a vacuum transfer chamber 106 in which two transfer arms 107a and 107b are provided, and film deposition apparatuses 108 and 109 according to embodiments of the present invention.

The wafer transfer cassette 101 is brought onto one of the cassette stages, and connected to a transfer in/out port provided between the cassette stage and the atmospheric transfer chamber 102. Then, a lid of the wafer cassette (FOUP) 101 is opened by an opening/closing mechanism (not shown) and the wafer is taken out from the wafer transfer cassette 101 by the transfer arm 103. Next, the wafer is transferred to the load lock chamber 104 (105). After the load lock chamber 104 (105) is evacuated, the wafer in the load lock chamber 104 (105) is transferred further to one of the film deposition apparatuses 108 and 109 by the transfer arm 107a (107b). In the film deposition apparatus 108 (109), a film is deposited on the wafer in such a manner as described above. Because the substrate process apparatus has two film deposition apparatuses 108, 109 that can house five wafers at a time, the ALD (or MLD) mode deposition can be performed at high throughput.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A film deposition apparatus configured to deposit a film on a substrate by carrying out a cycle of alternately supplying at least two kinds of reaction gases that react with each other to the substrate to stack multiple layers of a reaction product in a vacuum chamber so that a thin film is formed, the film deposition apparatus comprising:
   a rotation table rotatably provided in the vacuum chamber;
   a substrate providing area provided in one surface of the rotation table and where the substrate is provided;
   a first reaction gas supplying part configured to supply a first reaction gas to the surface of the substrate where the substrate providing area is provided;
   a second reaction gas supplying part configured to supply a second reaction gas to the surface of the substrate where the substrate providing area is provided, the second reaction gas supplying part being separated from the first reaction gas supplying part along a rotational direction of the rotation table;
   a separation area located along the rotational direction between a first process area in which the first reaction gas is supplied and a second process area in which the second reaction gas is supplied so that an atmosphere of the first process area and an atmosphere of the second process area are separated from each other, the separation area including a separation gas supplying part configured to supply a first separation gas, and a convex part projecting downward whose lower surface forms a first ceiling surface, the first process area and the second process area having a second ceiling surface, the lowest part of the first ceiling surface being lower than the lowest part of the second ceiling surface and configured to form in relation to the rotation table a narrow space in which the first separation gas flows from the separation area to the process area side so as to prevent the first reaction gas and the second reaction gas from entering the narrow space, the first ceiling surface being positioned at both sides in the rotational direction of the separation gas supplying part;
   a center part area that is located substantially in a center part of the chamber in order to separate the atmosphere of the first process area and the atmosphere of the second process area, the center part area having an ejection hole configured to eject a second separation gas and provided at a substrate providing surface side of the rotation table;
   an evacuation port configured to evacuate the reaction gas with the first separation gas diffused to both sides of the separation area and the second separation gas ejected from the center part area; and
   a substrate cooling part configured to jet nitrogen gas or inert gas onto the substrate in the vacuum chamber so that the substrate is cooled.

2. The film deposition apparatus as claimed in claim 1, wherein an elevation mechanism configured to elevate the substrate is provided at the substrate providing part; and the elevation mechanism includes three or more elevation pins.

3. The film deposition apparatus as claimed in claim 1, further comprising:
   a ceiling plate provided in the separation area where the first separation gas is supplied from the separation gas supplying part, the ceiling plate being provided to face the surface of the rotation table where the substrate providing area is formed;
   a second separation gas supplying part configured to supply the separation gas from the center area of the rotation table so that the first reaction gas and the second reaction gas are separated from each other; and
   a second evacuation port provided lower than the rotation table, the second evacuation port being configured to evacuate the first reaction gas, the second reaction gas, the first separation gas, and the second separation via a gap between a circumferential edge of the rotation table and an internal circumferential wall of the vacuum chamber.

4. The film deposition apparatus as claimed in claim 1, further comprising:
   a transfer opening provided at a side wall of the vacuum chamber, the transfer opening being configured to be opened or closed by a gate valve,
   wherein the substrate is transferred from an outside of the vacuum chamber to an inside of the vacuum chamber via the transfer opening.

5. The film deposition apparatus as claimed in claim 4, wherein the substrate is transferred via the transfer opening by a transfer arm.

6. The film deposition apparatus as claimed in claim 1, wherein the substrate cooling part is provided above the substrate providing area.

7. The film deposition apparatus as claimed in claim 1, wherein the substrate providing area is formed on a surface of the rotation table in a concave manner; and the surface of the rotation table and the surface of the substrate provided in the substrate providing area are situated at the same height or the surface of the substrate provided in the substrate providing area is lower than the surface of the rotation table.

8. The film deposition apparatus as claimed in claim 1, wherein a heating part configured to heat the rotation table is provided below the rotation table.

9. The film deposition apparatus as claimed in claim 1, wherein a heating part configured to heat the rotation table is provided above the rotation table.

10. A film deposition apparatus configured to deposit a film on a substrate by carrying out a cycle of alternately supplying at least two kinds of reaction gases that react with each other to the substrate to stack multiple layers of a reaction product in a vacuum chamber so that a thin film is formed, the film deposition apparatus comprising:

a rotation table rotatably provided in the vacuum chamber;
a plurality of substrate providing areas configured to receive the substrates, the substrate providing areas being provided on a same circumference of the rotation table;
a heating part configured to heat the rotation table;
a first reaction gas supplying part configured to supply a first reaction gas, the first reaction gas supplying part being provided at the substrate providing area side of the vacuum chamber;
a second reaction gas supplying part configured to supply a second reaction gas, the second reaction gas supplying part being provided at the substrate providing area side of the vacuum chamber, the second reaction gas supplying part being provided separately from the first second reaction gas supplying part;
a first separation gas supplying part configured to supply a first separation gas and provided in a separation area, the separation area being provided between a first process area and a second process area, the first process area being where the first reaction gas is supplied from the first reaction gas supplying part, the second process area being where the second reaction gas is supplied from the second reaction gas supplying part;
a ceiling plate facing the surface of the rotation table, the ceiling plate including a convex part partially projecting downward, the convex part being formed in the separation area, but not formed in the first process area and the second process area;
a transfer opening provided at a side wall of the vacuum chamber, the transfer opening being configured to be opened or closed by a gate valve, the transfer opening being used for transferring the wafer from an outside of the vacuum chamber to an inside of the vacuum chamber;
a transfer arm including two stick-shaped holding parts configured to hold the substrate, the transfer arm being configured to transfer the substrate via the transfer opening, one of the holding parts including at least one substrate holding part configured to hold the substrate, another of the holding parts including at least two substrate holding parts configured to hold the substrate; and
a substrate cooling part configured to jet nitrogen gas or inert gas onto the substrate in the vacuum chamber so that the substrate is cooled.

11. The film deposition apparatus as claimed in claim 10, further comprising:
a second separation gas supplying part configured to supply the second separation gas from a center area of the rotation table so as to separate the first reaction gas and the second reaction gas from each other; and
an evacuation port provided lower than the rotation table, the evacuation port being configured to evacuate the first reaction gas, the second reaction gas, the first separation gas, and the second separation via a gap between a circumferential edge of the rotation table and an internal circumferential wall of the vacuum chamber.

12. The film deposition apparatus as claimed in claim 10, wherein the substrate holding arm is configured to make a gap between two stick-shaped holding parts wide or narrow.

13. The film deposition apparatus as claimed in claim 10, wherein the substrate holding part includes a claw-shaped part; and
a concave area deeper than the substrate providing area is provided at an edge part of the substrate providing areas of the rotation table, corresponding to the claw-shaped part.

14. A substrate process apparatus, comprising:
a vacuum transfer room inside which a substrate transfer part is provided;
the film deposition apparatus as claimed in claim 1, the film deposition apparatus being hermetically connected to the vacuum transfer room; and
a preparatory vacuum chamber hermetically connected to the vacuum transfer room, the preparatory vacuum chamber being configured to change atmosphere between a vacuum atmosphere and an air atmosphere.

* * * * *